United States Patent
Numata

(10) Patent No.: US 9,319,607 B2
(45) Date of Patent: Apr. 19, 2016

(54) SOLID-STATE IMAGING SENSOR, RANGING DEVICE, AND IMAGING APPARATUS

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/831,122

(22) Filed: Aug. 20, 2015

(65) Prior Publication Data

US 2015/0358565 A1 Dec. 10, 2015

Related U.S. Application Data

(63) Continuation of application No. 14/327,924, filed on Jul. 10, 2014, now Pat. No. 9,160,942.

(30) Foreign Application Priority Data

Jul. 11, 2013  (JP) ................................ 2013-145559
Sep. 4, 2013  (JP) ................................ 2013-183017
May 8, 2014  (JP) ................................ 2014-097073
May 8, 2014  (JP) ................................ 2014-097074

(51) Int. Cl.
*G03B 3/10* (2006.01)
*G03B 13/34* (2006.01)
(Continued)

(52) U.S. Cl.
CPC ........ *H04N 5/3696* (2013.01); *H01L 27/14601* (2013.01); *H01L 27/14627* (2013.01); *H04N 5/335* (2013.01)

(58) Field of Classification Search
CPC .......... H04N 13/0239; H04N 5/23212; H04N 13/0022; H04N 13/0203; H04N 13/0271; H04N 13/0402; H04N 2013/0081; H04N 13/0445; H04N 5/335; H04N 5/369; H01L 27/14627; H01L 27/14601
USPC ......... 348/139, 135, 349, 350, 302–310, 348, 348/42–60; 396/121
See application file for complete search history.

(56) References Cited

U.S. PATENT DOCUMENTS 7,643,076 B2  1/2010  Yukawa
7,655,892 B2  2/2010  Oda et al.
(Continued)

FOREIGN PATENT DOCUMENTS

JP  2005-286565 A  10/2005
JP  2007-158109 A  6/2007
(Continued)

*Primary Examiner* — Chia-Wei A Chen
(74) *Attorney, Agent, or Firm* — Fitzpatrick, Cella, Harper & Scinto

(57) ABSTRACT

A solid-state imaging sensor provided with a plurality of pixels which convert an object image formed by an imaging optical system into an electrical signal, at least a part of the pixels being ranging pixels in which a first and a second photoelectric conversion unit are provided in alignment in a first direction, and in more than half of the ranging pixels in one of peripheral region of the solid-state sensor, the capacitance of the first photoelectric conversion unit being greater than the capacitance of the second photoelectric conversion unit; and in more than half of the ranging pixels in the other of peripheral region of the solid-state sensor, the capacitance of the second photoelectric conversion unit being greater than the capacitance of the first photoelectric conversion unit.

17 Claims, 15 Drawing Sheets

(51) Int. Cl.
*H04N 13/00* (2006.01)
*H04N 7/18* (2006.01)
*H04N 3/14* (2006.01)
*H04N 5/335* (2011.01)
*G03B 13/00* (2006.01)
*H04N 5/232* (2006.01)
*H04N 5/369* (2011.01)
*H01L 27/146* (2006.01)

(56) References Cited

U.S. PATENT DOCUMENTS

| | | |
|---|---|---|
| 7,948,534 B2 | 5/2011 | Meisenzahl |
| 8,013,920 B2 | 9/2011 | Dosluoglu et al. |
| 8,189,085 B2 | 5/2012 | Suzuki |
| 8,605,942 B2 | 12/2013 | Takeuchi |
| 8,817,153 B2 | 8/2014 | Bahukhandi et al. |
| 9,030,582 B2 | 5/2015 | Sugawa et al. |
| 2004/0017497 A1 | 1/2004 | Suzuki et al. |
| 2004/0051790 A1 | 3/2004 | Tamaru et al. |
| 2004/0085467 A1 | 5/2004 | Inokuma et al. |
| 2005/0248675 A1 | 11/2005 | Hashimoto et al. |
| 2006/0164529 A1 | 7/2006 | Shimizu |
| 2008/0018763 A1 | 1/2008 | Sato |
| 2009/0179161 A1* | 7/2009 | Ward .................... B82Y 10/00 250/492.21 |
| 2009/0213259 A1 | 8/2009 | Su et al. |
| 2010/0110251 A1 | 5/2010 | Cieslinski |
| 2011/0164132 A1 | 7/2011 | Buettgen et al. |
| 2011/0298956 A1 | 12/2011 | Giffard et al. |
| 2012/0033128 A1* | 2/2012 | Nagano .................... G02B 7/34 348/349 |
| 2012/0050713 A1* | 3/2012 | Inoue ........................ G01C 3/10 356/3.11 |
| 2012/0119068 A1 | 5/2012 | Numata |
| 2013/0107017 A1* | 5/2013 | Endo ........................ G03B 7/08 348/49 |
| 2013/0107086 A1 | 5/2013 | Nagano |
| 2013/0161774 A1* | 6/2013 | Okigawa .............. G02B 3/0056 257/432 |
| 2013/0235174 A1* | 9/2013 | Namii .................... G03B 11/00 348/65 |
| 2013/0258155 A1 | 10/2013 | Ueda |
| 2013/0278807 A1 | 10/2013 | Horiike et al. |
| 2014/0022427 A1 | 1/2014 | Goto et al. |
| 2014/0061486 A1* | 3/2014 | Bao ........................ G01J 3/0213 250/370.01 |
| 2014/0111627 A1* | 4/2014 | Ishigami ............. H04N 13/0011 348/51 |
| 2014/0184780 A1* | 7/2014 | Abe ...................... G02B 21/367 348/80 |
| 2014/0232917 A1 | 8/2014 | Kawahito et al. |
| 2014/0267613 A1* | 9/2014 | Cohen .................. G01S 7/4863 348/46 |
| 2014/0293102 A1* | 10/2014 | Vogelsang ........... H04N 5/3535 348/294 |
| 2014/0362273 A1 | 12/2014 | Okura et al. |
| 2015/0002713 A1 | 1/2015 | Nomura |
| 2015/0015752 A1 | 1/2015 | Numata |

FOREIGN PATENT DOCUMENTS

| | | |
|---|---|---|
| JP | 2007-158692 A | 6/2007 |
| JP | 2007-184840 A | 7/2007 |
| JP | 4835136 B2 | 12/2011 |
| JP | 2012-037777 A | 2/2012 |
| JP | 2012-049994 A | 3/2012 |

* cited by examiner

FIG. 11A
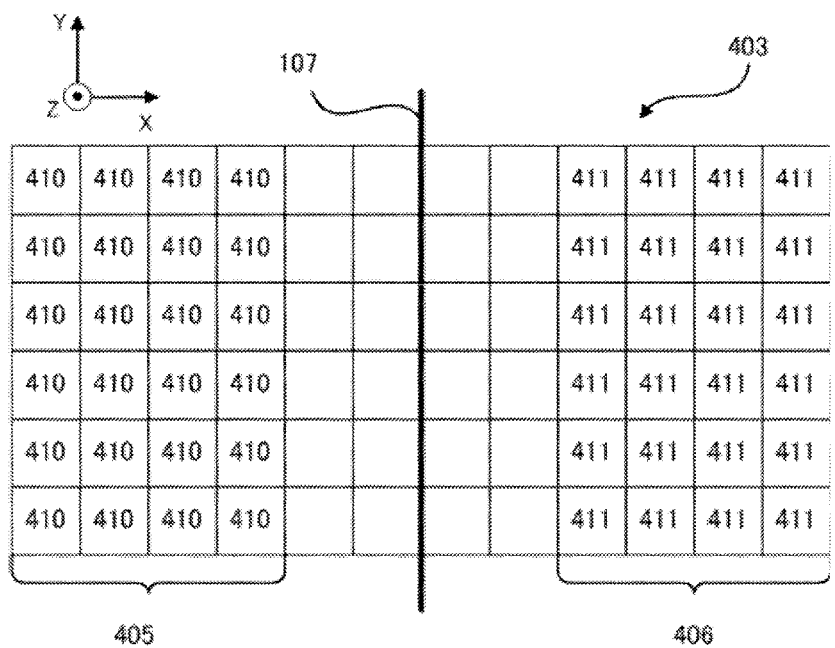
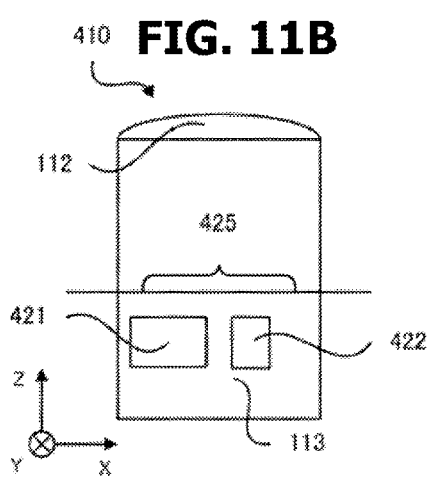
FIG. 11B
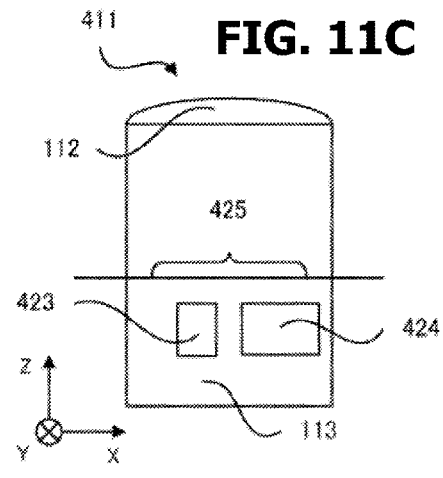
FIG. 11C
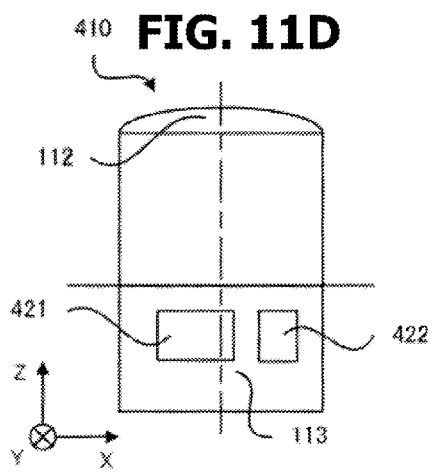
FIG. 11D
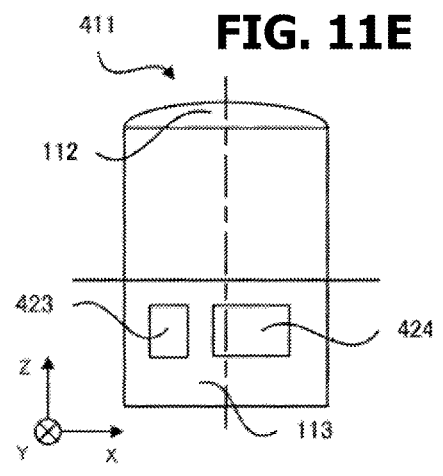
FIG. 11E

SOLID-STATE IMAGING SENSOR, RANGING DEVICE, AND IMAGING APPARATUS

This application is a continuation of application Ser. No. 14/327,924, filed Jul. 10, 2014, which has been allowed.

BACKGROUND OF THE INVENTION

1. Field of the Invention

The present invention relates to a solid-state imaging sensor, and more particularly, to a solid-state imaging sensor used in a ranging device.

2. Description of the Related Art

Ranging technology for auto-focus systems is known in digital still cameras and digital video cameras. In relation to ranging technology for auto-focus systems of this kind, Japanese Patent No. 04835136 proposes a solid-state imaging sensor which has a ranging function in a portion of the pixels of the solid-state imaging sensor, in such a manner that depth can be detected by a phase differential method. This phase differential method is a method in which two images which pass through different regions on the pupil in an imaging optical system (these images are herein after called "ranging images" below) are acquired, and the depth is detected by triangulation using a stereo image based on the amount of image shift between the ranging images. According to this method, unlike a conventional contrast method, there is no need to move the lens in order to measure the depth, and therefore a fast and highly accurate auto-focus system can be achieved.

However, depending on the imaging conditions, there may be a problem of decline in the ranging accuracy due to decline in the quality of the ranging images. In general, the exit pupil position of the imaging optical system varies depending on the zoom and focus conditions, and therefore the exit pupil position in the imaging optical system and the design pupil position of the imaging sensor do not necessarily coincide. If the design pupil position of the imaging sensor and the exit pupil position of the imaging optical system are different, then the amount of eccentricity of the pupil region through which the light beam received by each ranging pixel passes varies with the position of each ranging pixel in the imaging sensor. If the amount of eccentricity becomes large, then a differential occurs between the pupil transmittance distributions of the light beams which form the two ranging images. Furthermore, a differential also occurs between the pupil transmittance distributions of the light beams which form the two ranging images, due to vignetting.

If the exposure time is specified in accordance with a ranging image which has a relatively low pupil transmittance of the light beam forming the ranging image, then the ranging image having a relatively high pupil transmittance will readily become saturated. Conversely, if the exposure time is specified in accordance with a ranging image which has a relatively high pupil transmittance of the light beam forming the ranging image, then the ranging image having a relatively low pupil transmittance is liable to have an insufficient amount of light. From the above, since the quality of the ranging image declines, then the ranging accuracy also declines. When an object having a large contrast ratio is projected, the issue of decline in the quality of the ranging image is a particular problem.

SUMMARY OF THE INVENTION

In view of the problem described above, it is an object of the present invention to suppress decline in the quality of a ranging image, even when projecting an object having a high contrast ratio.

A first aspect of the present invention is a solid-state imaging sensor provided with a plurality of pixels which convert an object image formed by an imaging optical system into an electrical signal, at least a portion of the plurality of pixels being ranging pixels in which a first photoelectric conversion unit and a second photoelectric conversion unit are provided in alignment in a first direction, and when a region of the solid-state imaging sensor is divided into a first region and a second region by a straight line perpendicular to the first direction and passing through the center of the solid-state imaging sensor;

then in more than half of the ranging pixels in a region of the first region that is distanced by no less than a predetermined distance from the straight line, the capacitance of the first photoelectric conversion unit being greater than the capacitance of the second photoelectric conversion unit; and in more than half of the ranging pixels in a region of the second region that is distanced by no less than a predetermined distance from the straight line, the capacitance of the second photoelectric conversion unit being greater than the capacitance of the first photoelectric conversion unit.

According to the present invention, it is possible to suppress decline in the quality of the ranging image, and therefore the ranging accuracy is improved. A particularly beneficial effect is obtained when projecting an object having a larger contrast ratio.

Further features of the present invention will become apparent from the following description of exemplary embodiments with reference to the attached drawings.

BRIEF DESCRIPTION OF THE DRAWINGS

FIGS. 9A to 9E show an arrangement and structure of a solid-state imaging sensor relating to a third embodiment of the invention;

FIGS. 11A to 11E show an arrangement and structure of a solid-state imaging sensor relating to a fourth embodiment of the invention;

DESCRIPTION OF THE EMBODIMENTS

A ranging device according to an embodiment of the present invention is described below with reference to the drawings. Here, parts having the same function in all of the drawings are labeled with the same reference symbols, and repeated description is omitted.

[First Embodiment]
<Camera>

Figure 1:
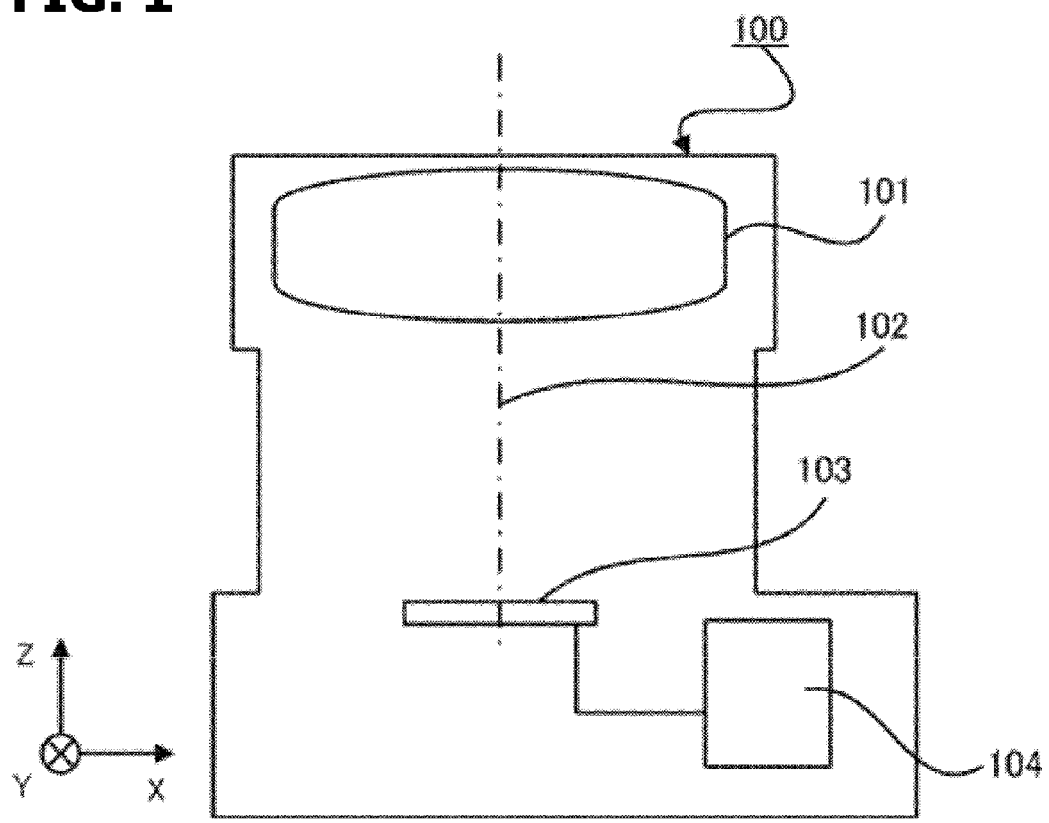
FIG. 1 is a compositional diagram of a digital camera relating to a first embodiment of the invention.

A digital camera (imaging apparatus) 100 according to the present embodiment is shown in FIG. 1. In FIG. 1, the digital camera 100 is constituted by an imaging optical system 101, a solid-state imaging sensor 103, and a computation processing unit 104. The solid-state imaging sensor 103 is disposed on an optical axis 102 of the imaging optical system 101, and the imaging optical system 101 forms an object image on the solid-state imaging sensor 103.

The solid-state imaging sensor 103 is provided with photodiodes that generate an electric charge upon detecting light, as photoelectric conversion elements (photoelectric conversion units). Any method may be employed for transferring the generated electric charge. In other words, the solid-state imaging sensor 103 may be a charge coupled device (CCD), or a complementary metal oxide semiconductor (CMOS).

The solid-state imaging sensor 103 is provided with a plurality of pixels, all of which are ranging pixels. The ranging pixels are provided with two photoelectric conversion units, which are respectively configured so as to selectively receive light from different pupil regions of the imaging optical system 101. Since an object image signal having parallax is obtained from the two photoelectric conversion units of the ranging pixels, then it is possible to calculate the object depth (distance between the camera and the object). A portion of the abovementioned plurality of pixels may be normal pixels for imaging. The imaging pixels are provided with only one photoelectric conversion unit and receive light from all of the pupil regions of the imaging optical system 101.

The computation processing unit 104 is constituted by a CPU and/or DSP and a memory storing a program, and by executing a program, detects the depth of the object or acquires an object image. The computation processing unit 104 may be implemented using an ASIC. A ranging device is constituted by the ranging function (depth calculation unit) of the imaging optical system 101, the solid-state imaging sensor 103 and the computation processing unit 104. Furthermore, an imaging apparatus is constituted by the imaging function (object image acquisition unit) of the ranging device and the computation processing unit 104. Commonly known technology can be employed for the object image acquisition function in the computation processing unit 104, and therefore detailed description thereof is omitted in the present specification.

<Ranging Pixels>

Figure 2A:
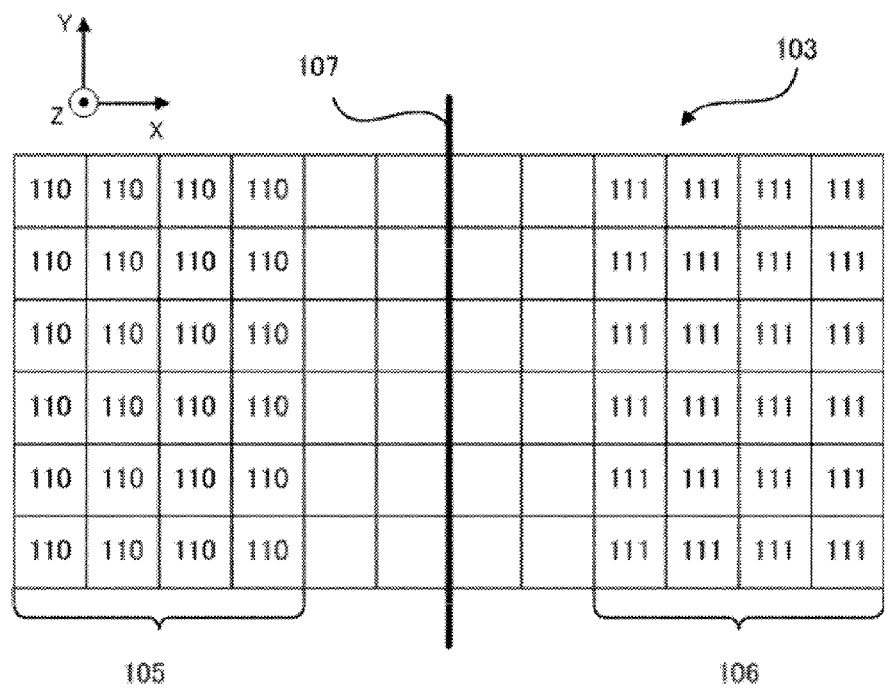
FIGS. 2A and 2B show an arrangement and structure of a solid-state imaging sensor relating to the first embodiment.

FIG. 2A is a diagram showing an arrangement of ranging pixels in the solid-state imaging sensor 103. Ranging pixels 110 are ranging pixels arranged within a peripheral region 105 in the −X direction of the solid-state imaging sensor 103, and ranging pixels 111 are ranging pixels arranged within a peripheral region 106 in the +X direction of the solid-state imaging sensor 103. The peripheral region 105 is a region which is distanced by at least a prescribed distance in the −X direction from a straight line 107 parallel to the Y direction, which is perpendicular to the X direction and passes through the center of the 103. On the other hand, the peripheral region 106 is a region distance by at least the prescribed distance in the +X direction from the straight line 107. In the example in FIG. 2A, the prescribed distance is ⅙ times the X-direction length of the solid-state imaging sensor 103. The X direction corresponds to the first direction in the present invention. The prescribed distance is desirably no less than 0.40 times, and more desirably, no less than 0.25 times, the X-direction length of the solid-state imaging sensor 103. The reason for this is as follows.

Figure 2B:
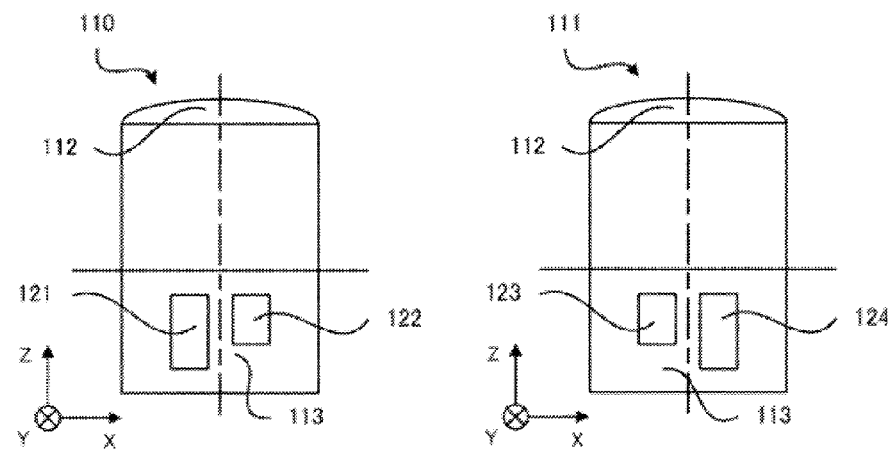

FIG. 2B is a cross-sectional diagram showing a configuration of the ranging pixels 110 and the ranging pixels 111. The ranging pixels 110 and the ranging pixels 111 have a microlens 112 and a substrate 113, from the side where the light is incident. The microlens 112 is made from $SiO_2$, or the like, which is a transparent material in the detected waveband, and the substrate 113 is made from a material such as Si, which has absorptivity in the detected waveband.

In the substrate 113, two photoelectric conversion units arranged in symmetrical positions in the X direction with respect to the optical axis of the microlens 112. The photoelectric conversion unit in the −X direction of the ranging pixel 110 is hereinafter called the photoelectric conversion unit 121, and the photoelectric conversion unit in the +X direction thereof is hereinafter called the photoelectric conversion unit 122, the photoelectric conversion unit in the −X direction of the ranging pixel 111 is hereinafter called the photoelectric conversion unit 123 and the photoelectric conversion unit in the +X direction thereof is hereinafter called the photoelectric conversion unit 124. The photoelectric conversion units 121, 123 arranged on the negative side of the X direction correspond to first photoelectric conversion units, and the photoelectric conversion units 122, 124 arranged on the positive side of the X direction correspond to second photoelectric conversion units. In other words, the first photoelectric conversion units and the second photoelectric conversion units are two photoelectric conversion units provided alongside each other in the X direction.

The photoelectric conversion unit 121 and the photoelectric conversion unit 122, and the photoelectric conversion unit 123 and the photoelectric conversion unit 124 have the same shape in the imaging plane of the substrate 113 (the XY plane). Furthermore, the photoelectric conversion unit 121 has a greater length than the photoelectric conversion unit 122 in the direction perpendicular to the imaging plane (Z direction). Furthermore, the photoelectric conversion unit 124 has a greater length than the photoelectric conversion unit 123 in the direction perpendicular to the imaging plane (Z direction). Below, the length of a photoelectric conversion unit in the Z direction is called the depth of the photoelectric conversion unit.

The deeper the photoelectric conversion unit, the greater the capacitance of the photoelectric conversion unit. More specifically, the capacitance of the photoelectric conversion unit 121 on the −X direction side is greater than the capacitance of the photoelectric conversion unit 122 on the +X direction side, in the region (105) which is distanced by no less than a prescribed distance in the −X direction from the straight line 107 in the Y direction which passes through the center of the solid-state imaging sensor 103. On the other hand, the capacitance of the photoelectric conversion unit 124 on the +X direction side is greater than the capacitance of the photoelectric conversion unit 123 on the −X direction side, in the region (106) which is distanced by no less than a prescribed distance in the +X direction from the straight line 107 in the Y direction which passes through the center of the solid-state imaging sensor 103.

The photoelectric conversion units are formed by doping the substrate 113 with boron ions, or the like. Furthermore, wires (not illustrated) are provided on the substrate 113 and the electrical charge generated by the photoelectric conversion units is transferred to a signal processing circuit by the wires.

<Sensitivity Characteristics of Photoelectric Conversion Units>

Figure 3:
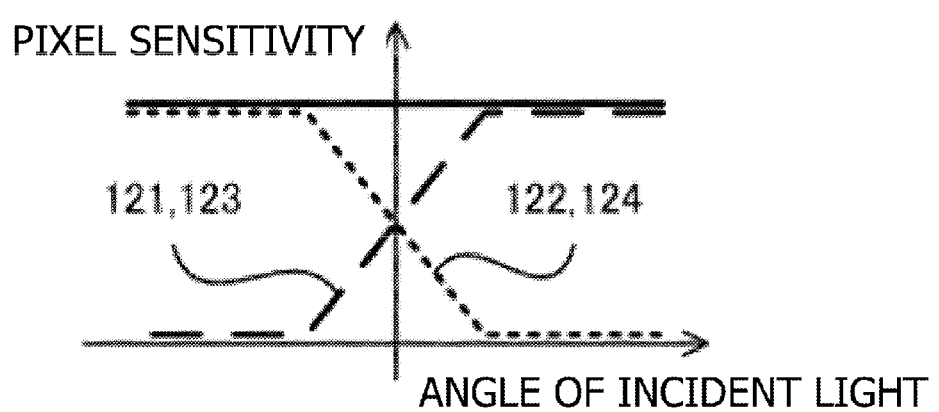
FIG. 3 shows sensitivity characteristics of ranging pixels relating to the first embodiment.

By adopting a composition of this kind, it is possible to make the sensitivity of the photoelectric conversion unit 121 and the photoelectric conversion unit 122 and the sensitivity of the photoelectric conversion unit 123 and the photoelectric conversion unit 124 have respectively different dependence on the angle of incidence in the XZ cross-section. FIG. 3 shows the dependence of the sensitivities of the photoelectric conversion units on the angle of incidence. The sensitivity characteristics of the photoelectric conversion unit 122 and the photoelectric conversion unit 124 (dotted line) show high sensitivity with respect to incident light from the negative direction (−X direction) and low sensitivity with respect to incident light from the positive direction (+X direction). On the other hand, the sensitivity characteristics of the photoelectric conversion unit 121 and the photoelectric conversion unit 123 (broken line) show low sensitivity with respect to incident light from the negative direction (−X direction) and high sensitivity with respect to incident light from the positive direction (+X direction). In other words, the photoelectric conversion unit 121 and the photoelectric conversion unit 123 selectively receive the light beam passing through the pupil regions 131, 133 in the +X direction (first pupil regions), which are one portion of the exit pupil 130 of the imaging optical system. On the other hand, the photoelectric conversion unit 122 and the photoelectric conversion unit 124 selectively receive the light beam passing through the pupil regions 132, 134 in the −X direction (second pupil regions), which are one portion of the exit pupil 130 of the imaging optical system.

<Microlens>

Furthermore, since the two photoelectric conversion units are arranged in mutually symmetrical positions with respect to the optical axis of the microlens 112, and have the same opening shapes, then the sensitivity characteristics have a symmetrical shape with respect to the 0-degree axis of the angle of incidence. Consequently, if the distance between the exit pupil 130 of the imaging optical system 101 and the solid-state imaging sensor 103 is infinite, then the pupil region 131 and the pupil region 132, and the pupil region 133 and the pupil region 134 are symmetrical about the center of the exit pupil 130.

In other words, the pupil transmittance distribution of the pupil region 131 and the pupil transmittance distribution of the pupil region 132 have centers of gravity in different positions. Similarly, the pupil transmittance distribution of the pupil region 133 and the pupil transmittance distribution of the pupil region 134 have centers of gravity in different positions. Here, the direction of the straight line linking the center of gravity of the pupil transmittance distribution of the pupil region 131 (133) and the pupil transmittance distribution of the pupil region 132 (134) is the X direction.

<Reasons for Difference in Pupil Transmittance and Associated Problems>

If the distance between the exit pupil 130 and the solid-state imaging sensor 103 is kept infinite at all times, then due to the sensitivity characteristics shown in FIG. 3, the pupil transmittances of the pupil region 131 and the pupil region 132 are both the same ideally. Therefore, the amount of light incident on the photoelectric conversion unit 121 and the photoelectric conversion unit 122 is the same. Similarly, the pupil transmittances of the pupil region 133 and the pupil region 134 are the same as each other, and the amount of light incident on the photoelectric conversion unit 123 and the photoelectric conversion unit 124 is the same.

However, in an actual digital camera, as described below, the pupil transmittance of the pupil region 131 and the pupil region 132, and the pupil transmittance of the pupil region 133 and the pupil region 134 are not the same as each other. The reasons for this will now be described.

Due to requirements for compactification in a digital camera 100, the exit pupil position of the imaging optical system 101 varies with the zoom conditions. In general, on the telephoto side, the position of the exit pupil 130 is distant from the solid-state imaging sensor, and on the wide-angle side, the position of the exit pupil 130 is close to the solid-state imaging sensor. Furthermore, if the imaging lens is an inner focus or a rear focus configuration, then the position of the exit pupil 130 also varies with the focus conditions. Therefore, in the ranging pixels 110 which are positioned in a peripheral region that is distanced in the X direction from the center of the solid-state imaging sensor 103, the pupil transmittance of the pupil region 131 and the pupil region 132 and the pupil transmittance of the pupil region 133 and the pupil region 134 are not the same as each other.

Furthermore, even supposing that the distance between the exit pupil 130 and the solid-state imaging sensor 103 is kept at infinity at all times, there are cases where the amount of light passing through the periphery of the exit pupil 130 declines due to vignetting inside the imaging optical system 101. In this case, in the ranging pixels which are positioned in a peripheral region of the solid-state imaging sensor, the pupil transmittance of the pupil region 131 and the pupil region 132 and the pupil transmittance of the pupil region 133 and the pupil region 134 are not the same as each other.

Figure 4B:
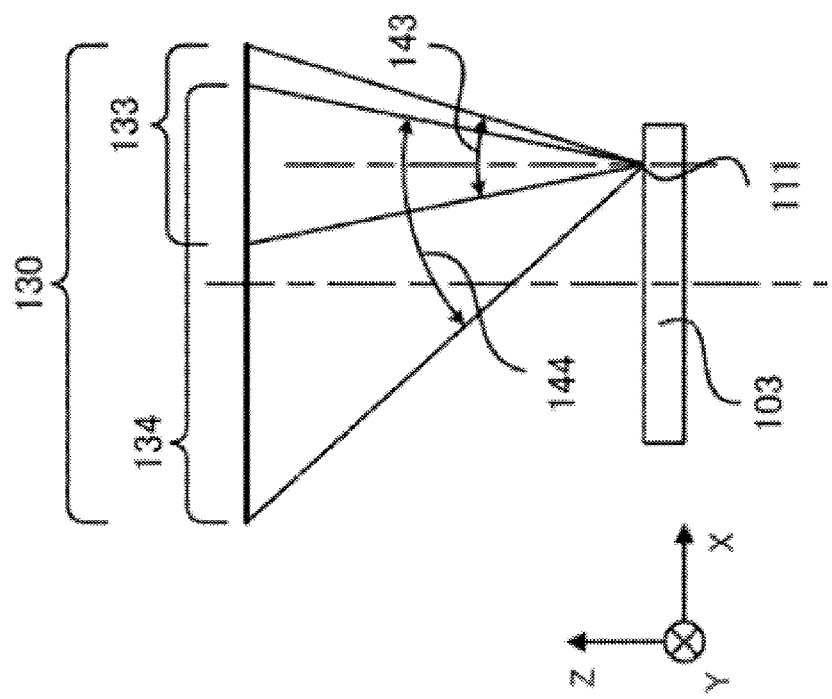
FIGS. 4A and 4B show a light beam which is received by a photoelectric conversion unit relating to the first embodiment.
Figure 4A:
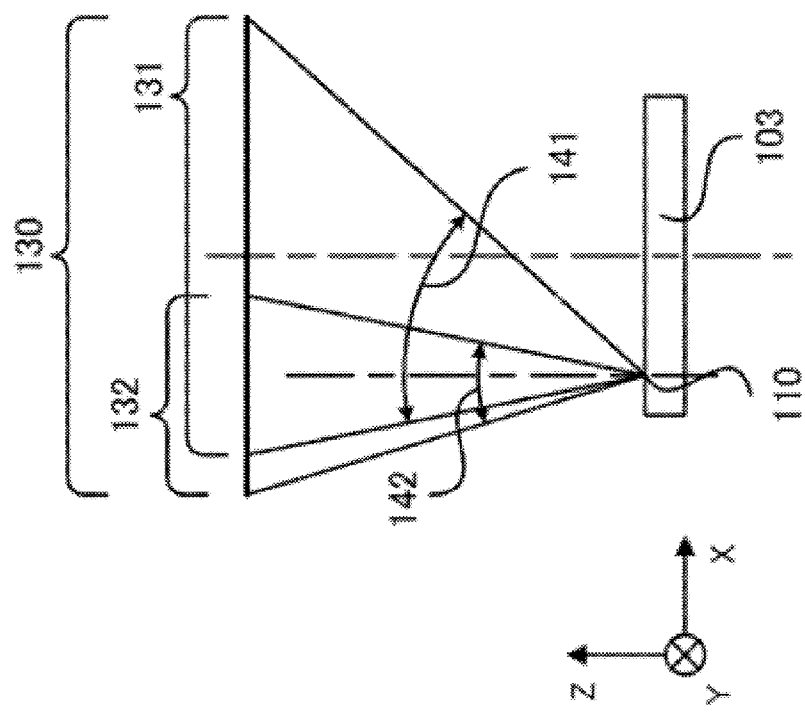

FIGS. 4A and 4B show a case where the exit pupil 130 is at a finite distance from the solid-state imaging sensor 103 (this corresponds to a case where an image is captured on the wide angle-side of the zoom lens, for example).

FIG. 4A shows the state of a light beam received by the ranging pixel 110 in the peripheral region 105 in the −X direction (the negative direction of the first direction) from the center of the solid-state imaging sensor 103. The photoelectric conversion unit 121 receives a light beam 141 from the pupil region 131, and the photoelectric conversion unit 122 receives a light beam 142 from the pupil region 132. As can be seen from FIG. 4A, the broadening angle of the light beam 141 is greater than the broadening angle of the light beam 142. Therefore, the pupil transmittance of the pupil region 131 is higher than the pupil region 132 and the amount of light received by the photoelectric conversion unit 121 is greater than the amount of light received by the photoelectric conversion unit 122.

FIG. 4B shows the state of a light beam received by the ranging pixel 111 in the peripheral region 106 in the +X direction (the positive direction of the first direction) from the center of the solid-state imaging sensor 103. The photoelectric conversion unit 123 receives a light beam 143 from the pupil region 133, and the photoelectric conversion unit 124 receives a light beam 144 from the pupil region 134. As can be seen from FIG. 4B, the broadening angle of the light beam 144 is greater than the broadening angle of the light beam 143. Therefore, the pupil transmittance of the pupil region 134 is higher than the pupil region 133 and the amount of light received by the photoelectric conversion unit 124 is greater than the amount of light received by the photoelectric conversion unit 123.

In a conventional solid-state imaging sensor in which the capacities of the two photoelectric conversion units are the same, as disclosed in Japanese Patent No. 04835136, there is a problem of a trade-off between an insufficient amount of light and saturation. More specifically, if the exposure time is specified in accordance with the photoelectric conversion units 122, 123 which receive a relatively small amount of light, then the photoelectric conversion units 121, 124 which receive a large amount of light are liable to become saturated. Conversely, if the exposure time is specified in accordance with the photoelectric conversion units 121, 124 which receive a relatively large amount of light, then an insufficiency in the amount of light occurs in the photoelectric conversion units 122, 123 which receive a small amount of light. If saturation or insufficiency in the amount of light occurs, then the quality of the ranging image declines, and the ranging accuracy declines. In particular, when an object having a large contrast ratio is projected, the issue of decline in the quality of the ranging image is a particular problem.

<Effects of Change in Capacitance of Photoelectric Conversion Units>

In the solid-state imaging sensor 103 according to the present embodiment, the depth of the photoelectric conversion units 121, 124 which receive a relatively large amount of light is made greater than the depth of the photoelectric conversion units 122, 123 which receive a relatively small amount of light. In other words, the capacitance of the photoelectric conversion units 121, 124 receiving light in the pupil regions 131, 134 having high pupil transmittance is made greater than that of the photoelectric conversion units 122, 123 which receive light from the pupil regions 132, 133 having low pupil transmittance. Therefore, it is possible to simultaneously resolve insufficiency in the amount of light in the photoelectric conversion units 122, 123, and saturation of the photoelectric conversion units 121, 124 which receive the light passing through the pupil regions 131, 134.

To change the depth of the photoelectric conversion units, the depth of ion doping may be changed. Furthermore, the density of impurities in the photoelectric conversion units may also be changed. In other words, the impurity density in the first photoelectric conversion unit may be made higher than the impurity density in the second photoelectric conversion unit. The higher the impurity density, the deeper the effective depth of the photoelectric conversion unit. The density of doped ions may also be raised in order to increase the impurity density.

<Depth Detection Processing>

A process for calculating the object depth which is carried out by the computation processing unit 104 will now be described. The computation processing unit 104 acquires a first ranging image from signals obtained from the photoelectric conversion units 121 of the ranging pixels 110 and the photoelectric conversion units 123 of the ranging pixels 111. Similarly, the computation processing unit 104 acquires a second ranging image from signals obtained from the photoelectric conversion units 122 of the ranging pixels 110 and the photoelectric conversion units 124 of the ranging pixels 111. The computation processing unit 104 then determines the amount of image deviation between the two ranging images. The amount of image deviation should be measured by a commonly known technique using correlation values, or the like. When the amount of image deviation between two ranging images is obtained, the depth of the object can be calculated on the basis of the theory of triangulation.

<Summary>

In this way, if the design pupil position of the solid-state imaging sensor 103 and the exit pupil position of the imaging optical system 101 are different, the pupil transmittance of the pupil regions corresponding to the two photoelectric conversion units in the ranging pixels are different. As can be seen from FIGS. 2A and 2B and FIGS. 4A and 4B, the relationship between the magnitudes of the transmittances of the two pupil regions is inverted, on either side of the straight line 107 which is perpendicular to the X direction (first direction) and passes through the center of the solid-state imaging sensor 103. Therefore, the positional relationship in the X direction of the photoelectric conversion units which receive a larger amount of light is reversed between the region 105 and the region 106 on either side of the straight line 107. In other words, in the case of the first embodiment, within the ranging pixels 110 in the region 105, the photoelectric conversion unit 121 which is positioned in the −X direction receives a larger amount of light than the photoelectric conversion unit 122 which is positioned in the +X direction. On the other hand, in the ranging pixels 111 in the region 106, the photoelectric conversion units 124 positioned in the +X direction receive a greater amount of light than the photoelectric conversion units 123 positioned in the +X direction.

By setting the capacitance of the photoelectric conversion units which receive light from the pupil regions having high pupil transmittance to be larger than the capacitance of the photoelectric conversion units which receive light from the pupil regions having low pupil transmittance, as indicated in the present embodiment, it is possible to avoid problems of saturation and insufficiency in the amount of light. More specifically, even if an exposure time is set which only enables a sufficient amount of light to be received from the pupil regions having a lower pupil transmittance, it is possible to avoid saturation in the other photoelectric conversion units because the capacitance thereof is greater. Consequently, even in the case of capturing an image of an object having a high contrast ratio, it is possible to suppress decline in the quality of the ranging images and to achieve highly accurate ranging, without the occurrence of saturation or insufficiency in the amount of light.

As described above, by adopting the present embodiment, it is possible to achieve improvement in the ranging accuracy and improvement in the quality of the captured image, throughout the whole surface of the solid-state imaging sensor, regardless of the zoom conditions or the focus conditions.

In a prior art solid-state imaging sensor, a method might be envisaged in which the capacities of the first photoelectric conversion units and the second photoelectric conversion units are both increased. However, if the capacitance of the photoelectric conversion units is increased more than necessary, then this leads to increase in power consumption and decline in the read-out rate, which is undesirable. In the present embodiment, since the photoelectric conversion units which receive a relatively small amount of light have a relatively small capacitance, and the photoelectric conversion units which receive a relatively large amount of light have a relatively large capacitance, then increase in the power consumption and decline in the read-out rate can be suppressed.

It is even more desirable if the magnitude of the drift electric field in the lateral direction in the second photoelectric conversion units which have a relatively large capacitance is made greater than the magnitude of the drift electric field in the first photoelectric conversion units which have a relatively small capacitance. The reason for this is that the transfer rate of the electric charge becomes slower, as the capacitance of the photoelectric conversion units is larger. By making the magnitude of the drift electric field in the second photoelectric conversion units which have a relatively large capacitance greater than the magnitude of the drift electric field in the first photoelectric conversion units which have a relatively small capacitance, it is possible to suppress differences in the transfer rate of the electrical charge. More specifically, a gradient of the impurity distribution should be formed in the lateral direction, by carrying out a plurality of doping actions in a staggered fashion in the lateral direction.

<Identification of Depth to Peripheral Region and Modification of First Embodiment>

The difference between the pupil transmittances of the two pupil regions corresponding to the two photoelectric conversion units of a ranging pixel 110 becomes greater, as the distance between the ranging pixel 110 and the straight line 107 passing through the center of the solid-state imaging sensor 103 is larger. The difference in the pupil transmittance is particularly large in a region distanced by no less than 0.25 times the X-direction length of the solid-state imaging sensor 103, from the straight line 107 (in a region less than ¼ of the whole area from the end of the solid-state imaging sensor 103 in the X direction). Furthermore, the difference in the pupil transmittance is very pronounced in a region distanced by no less than 0.40 times the X-direction length of the solid-state imaging sensor 103, from the straight line 107 (in a region less than ⅒ of the whole area from the end of the solid-state imaging sensor 103 in the X direction). Consequently, the distance between the straight line 107 and the peripheral regions 105 and 106 is desirably no less than 0.40 times, and more desirably, no less than 0.25 times, the X-direction length of the solid-state imaging sensor 103.

Figure 5A:
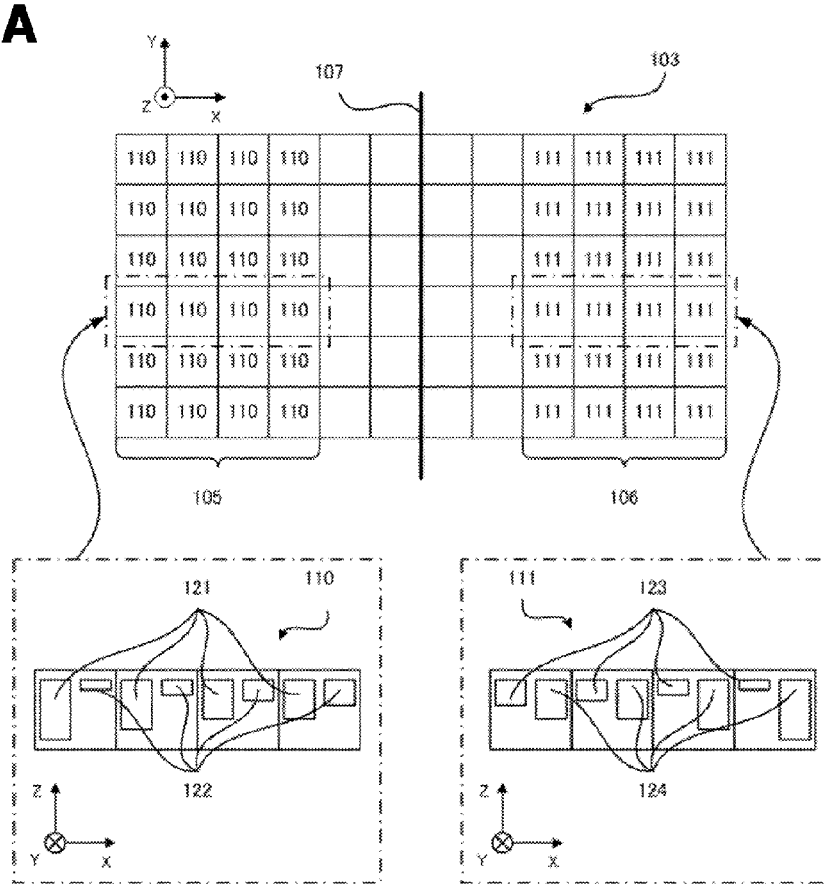
FIGS. 5A and 5B show a modification of a solid-state imaging sensor relating to the first embodiment.

Furthermore, desirably, the difference in capacitance between the two photoelectric conversion units is made greater, the position of the ranging pixel from the center of the solid-state imaging sensor (straight line 107) is further, in accordance with the difference in pupil transmittance. FIG. 5(A) is an example in which the difference in capacitance between the two photoelectric conversion units is made greater in accordance with the position of the ranging pixel. In FIG. 5A, region 105 is a region to the −X direction side of the straight line 107, which is distanced from the straight line 107 by no less than ⅙ in the X-direction length of the solid-state imaging sensor 103. Similarly, region 106 is a region to the +X direction side of the straight line 107, which is distanced from the straight line 107 by no less than ⅙ in the X-direction length of the solid-state imaging sensor 103. On the lower side of FIG. 5A, the depths of the photoelectric conversion units is shown in relation to the four ranging pixels which are surrounded by the broken lines in the peripheral regions 105 and 106. In this example, progressively along the peripheral section, the capacitance of the photoelectric conversion units 121, 124 corresponding to the pupil regions having large pupil transmittance becomes larger and the capacitance of the photoelectric conversion units 122, 123 corresponding to the pupil regions having small pupil transmittance becomes smaller. However, another method can also be employed to make the difference in the capacities larger, progressively along the peripheral section. For example, it can be envisaged that the capacitance of the photoelectric conversion units 121, 124 is fixed while the capacitance of the photoelectric conversion units 122, 123 becomes smaller along the peripheral section. It can also be envisaged that, conversely, the capacitance of the photoelectric conversion units 122, 123 is fixed while the capacitance of the photoelectric conversion units 121, 124 becomes larger along the peripheral section.

Alternatively, the capacities of all of the photoelectric conversion units 121 to 124 may be changed. Furthermore, it can be envisaged that the rate of decrease may be made greater in the photoelectric conversion units 122, 123, compared to the photoelectric conversion units 121, 124. In general, since the amount of incident light is smaller, the further the position of the pixel in the peripheral region of the solid-state imaging sensor, then desirably, the capacitance of each of the photoelectric conversion units 121 to 124 is made smaller towards the periphery, and this rate of decrease is made greater in the photoelectric conversion units 122, 123 compared to the photoelectric conversion units 121, 124. More specifically, desirably, the difference in capacitance of the photoelectric conversion units is made greater toward the peripheral section, by making the capacitance of the photoelectric conversion units smaller, the greater the distance of the pixel from the center, and by altering the rate of decrease corresponding to the distance between the photoelectric conversion units in the pixel. By adopting a composition of this kind, it is possible to avoid problems of saturation and insufficiency of the amount of light, between different ranging pixels.

(Ranging Pixels in the Vicinity of the Center)

Conversely to the description given above, in a region in the vicinity of the center of the solid-state imaging sensor 103, in other words, a region which is less than a prescribed distance from the straight line 107 perpendicular to the X direction that passes through the center of the solid-state imaging sensor 103, the difference between the pupil transmittances of the two pupil regions corresponding to the two photoelectric conversion units is small. More specifically, if the distance from the straight line 107 is less than 0.25 times the X-direction length of the solid-state imaging sensor 103, then the difference in the pupil transmittance is small. Therefore, in a central region 108 of the solid-state imaging sensor 103, a difference does not have to be provided between the capacities of the two photoelectric conversion units in the ranging pixel, and the capacities of the photoelectric conversion units corresponding to the pupil regions having relatively high pupil transmittance may be made relatively small. In the vicinity of the center of the solid-state imaging sensor 103, even if the capacitance of the photoelectric conversion units which receive light passing through the pupil region having low pupil transmittance is equal to or greater than the capacitance of the other photoelectric conversion units in this way, the level of quality deterioration of the ranging pixel is small and serious problems do not arise.

Figure 5B:
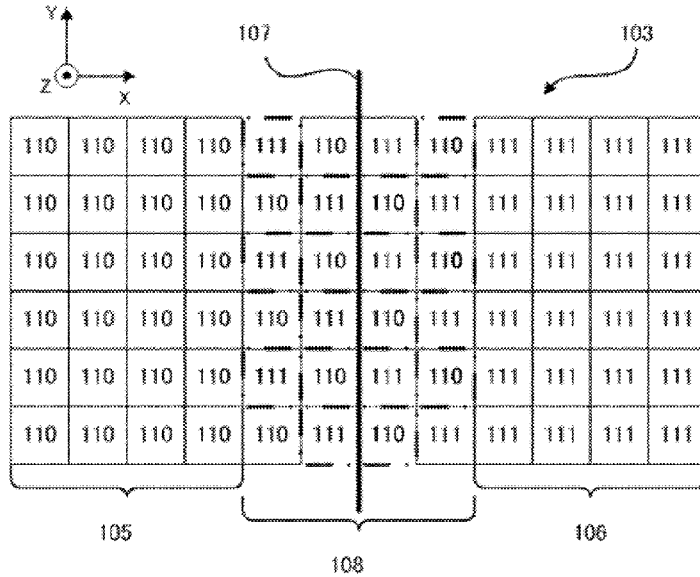

FIG. 5B is a diagram showing one example of the present modification. In FIG. 5B, the region 108 surrounded by the broken line is a region where the distance from the straight line 107 is within ⅙ the X-direction length of the solid-state imaging sensor 103. In the example in FIG. 5B, in the region 108, ranging pixels 111 are also provided on the −X direction side of the straight line 107, and ranging pixels 110 are also provided on the +X direction side of the straight line 107. As described above, in the ranging pixels in the region 108, the two photoelectric conversion units may have the same capacitance. Alternatively, the ranging pixels on the −X direction side of the straight line 107 in the region 108 may all be ranging pixels 111, and the ranging pixels on the +X direction side of the straight line 107 may all be ranging pixels 110.

Instead of this, it is also possible to omit the central region and to provide the two regions 105 and 106 in adjacent fashion. In other words, the whole region on the −X direction side of the straight line 107 may be set as region 105, and the whole region on the +X direction side of the straight line 107 may be set as region 106. This corresponds to a case where the prescribed distance mentioned above is set to zero.

(Tolerance of Existence of Ranging Pixels not Satisfying Conditions)

In the description given above, the capacitance of the photoelectric conversion units corresponding to a pupil region having a high pupil transmittance is made greater than the capacitance of the other photoelectric conversion units, in all of the ranging pixels in the region 105 and the region 106. However, it is also possible for a portion of the ranging pixels in the region 105 and the region 106 to be ranging pixels in which the capacitance of the photoelectric conversion unit corresponding to a pupil region having a low pupil transmittance is equal to or lower than the capacitance of the other photoelectric conversion unit.

Ranging pixels in which the capacitance of the photoelectric conversion unit (121) on the negative direction side of the X direction is greater than the capacitance of the photoelectric conversion unit (122) on the positive direction side of the X direction should at least be present in the region to the negative direction side of the X direction from the center of the solid-state imaging sensor 103 (the region 105). Furthermore, in a similar fashion, ranging pixels in which the capacitance of the photoelectric conversion unit (124) on the positive direction side of the X direction is greater than the capacitance of the photoelectric conversion unit (123) on the negative direction side of the X direction should be present in the region to the positive direction side of the X direction from the center of the solid-state imaging sensor 103 (the region 106). Decline in the quality of the ranging images can be suppressed in ranging pixels having a composition of this kind.

In order to effectively suppress decline in the quality of the ranging image, it is desirable that the capacitance should satisfy the abovementioned condition in at least a prescribed ratio or more of the ranging pixels within each region. More specifically, it is desirable that the capacitance of the photoelectric conversion unit corresponding to a pupil region having a high pupil transmittance should be relatively large in at least a prescribed ratio of the ranging pixels (for example, more than half of the ranging pixels). Here, desirably, at least more than half of the ranging pixels satisfy the abovementioned conditions, and the greater the ratio of such pixels, the better. For example, more desirably, the prescribed ratio is 80% or more.

(Presence of Normal Imaging Pixels)

All of the pixels of the solid-state imaging sensor 103 may be ranging pixels, or only a portion of the pixels may be ranging pixels. If all of the pixels are ranging pixels, then it is possible to acquire a captured image by taking the sum of the ranging images acquired by the two photoelectric conversion units. If a portion of the pixels are ranging pixels, then the other pixels are normal imaging pixels which are provided with one photoelectric conversion unit that receives light from all of the pupil regions of the imaging optical system 101. In this case, the captured image in a ranging pixel may be acquired by a similar method to that described above, or may be determined by complementing with a captured image acquired by normal imaging pixels provided about the periphery of the ranging pixel.

[Second Embodiment]

<Ranging Pixels>

The solid-state imaging sensor 203 according to the second embodiment is optimized in cases where the exit pupil 130 of the imaging optical system 101 is positioned near to the solid-state imaging sensor 203.

Figure 6A:
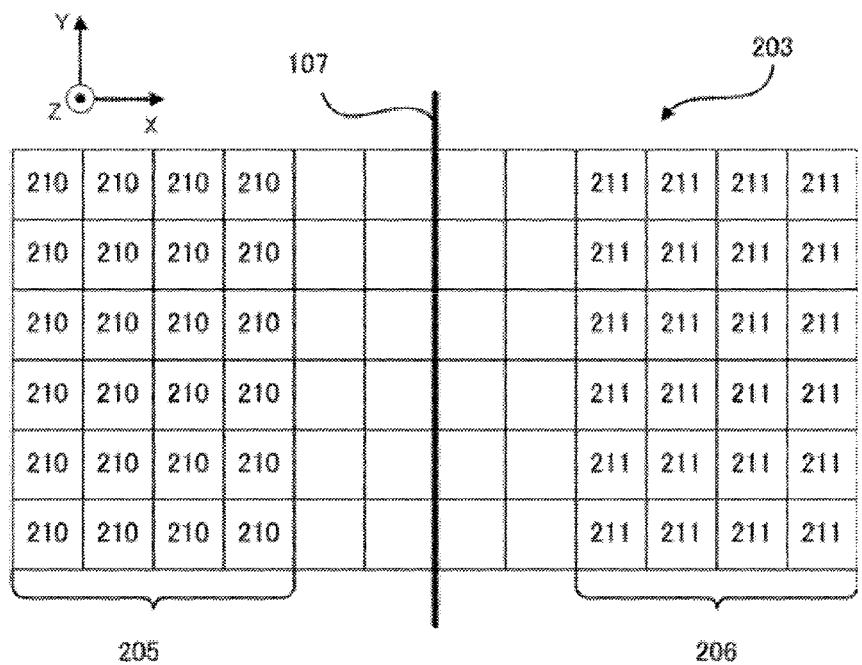
FIGS. 6A and 6B show an arrangement and structure of a solid-state imaging sensor relating to a second embodiment.
Figure 6B:
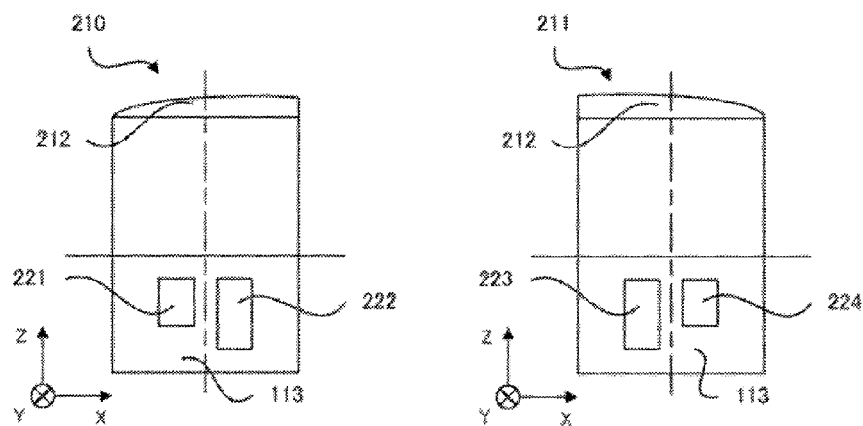

FIG. 6A shows the arrangement of ranging pixels 210 and ranging pixels 211 included in the solid-state imaging sensor 203, and FIG. 6B is a cross-sectional diagram showing the composition of the ranging pixels 210 and 211.

The ranging pixels 210 and the ranging pixels 211 according to the present embodiment differ from the ranging pixels 110 and the ranging pixels 111 relating to the first embodiment in terms of the shape of the microlenses and the depth of the photoelectric conversion units. The microlens 212 is arranged off-center in such a manner that the main light ray passing through the center of the exit pupil 130 which is positioned near to the solid-state imaging sensor 203 is incident at an intermediate position between the photoelectric conversion unit 221 and the photoelectric conversion unit 222. In other words, in the ranging pixels 210 in the peripheral region 205 in the negative direction (−X direction) with respect to the center of the solid-state imaging sensor 203, the microlens 212 is arranged off-center in the positive direction (+X direction). On the other hand, in the ranging pixels 211 of the peripheral region 206 in the positive direction (+X direction) with respect to the center of the solid-state imaging sensor 203, the microlens 212 is arranged off-center in the negative direction (−X direction).

Furthermore, the photoelectric conversion units 222 are deeper than the photoelectric conversion units 221, and the photoelectric conversion units 223 are deeper than the photoelectric conversion units 224. In other words, the capacitance of the photoelectric conversion unit 222 on the +X direction side is greater than the capacitance of the photoelectric conversion unit 221 on the −X direction side, in the region (205) which is distanced by no less than a prescribed distance in the −X direction from the straight line 107 in the Y direction which passes through the center of the solid-state imaging sensor 203. On the other hand, the capacitance of the photoelectric conversion unit 223 on the −X direction side is greater than the capacitance of the photoelectric conversion unit 224 on the +X direction side, in the region (206) which is distanced by no less than a prescribed distance in the +X direction from the straight line 107 in the Y direction which passes through the center of the solid-state imaging sensor 203.

<Sensitivity Characteristics of Photoelectric Conversion Units>

Figure 7A:
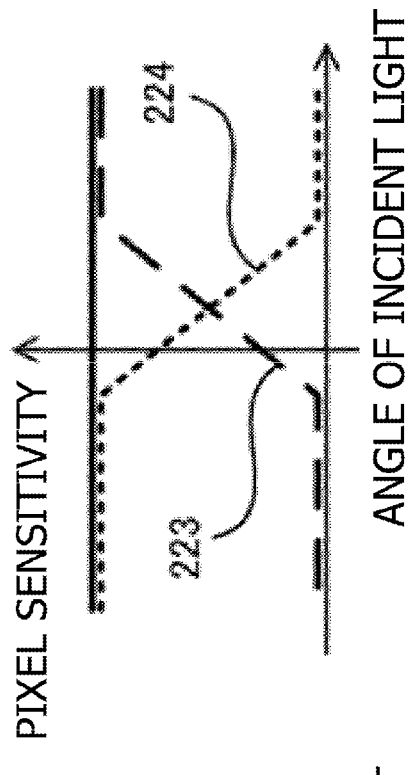
FIGS. 7A and 7B show sensitivity characteristics of a ranging pixel relating to the second embodiment of the invention.
Figure 7B:
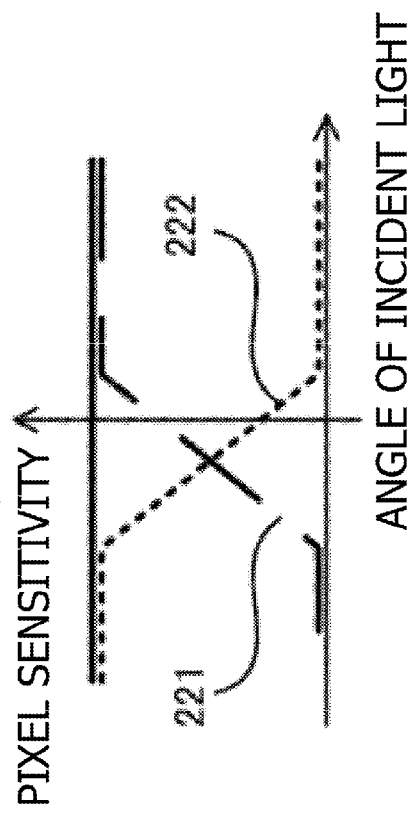

FIGS. 7A and 7B show the dependence of the sensitivities of the photoelectric conversion units on the angle of incidence. The sensitivity characteristics of the photoelectric conversion unit 222 and the photoelectric conversion unit 224 (dotted line) show high sensitivity with respect to incident light from the negative direction (−X direction) and low sensitivity with respect to incident light from the positive direction (+X direction). On the other hand, the sensitivity characteristics of the photoelectric conversion unit 221 and the photoelectric conversion unit 223 (broken line) show low sensitivity with respect to incident light from the negative direction (−X direction) and high sensitivity with respect to incident light from the positive direction (+X direction). The sensitivity characteristics of the photoelectric conversion unit 221 and the photoelectric conversion unit 222 are shifted in the negative direction with respect to the sensitivity characteristics of the photoelectric conversion units 121, 122. Similarly, the sensitivity characteristics of the photoelectric conversion unit 223 and the sensitivity characteristics of the photoelectric conversion unit 224 are shifted to the positive direction with respect to the sensitivity characteristics of the photoelectric conversion units 123, 124.

<Reasons for Difference in Pupil Transmittance and Associated Problems>

Figure 8A:
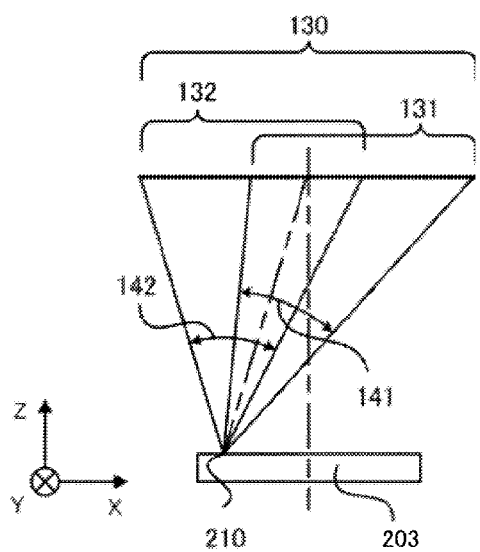
FIGS. 8A to 8D show a light beam which is received by a photoelectric conversion unit relating to the second embodiment.
Figure 8B:
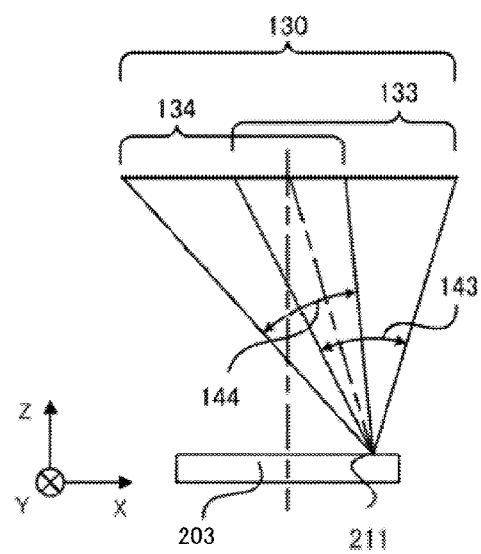

If a solid-state imaging sensor 203 of this kind is used, then the pupil region 131 and the pupil region 132 are centrally symmetrically on the exit pupil 130 when the solid-state imaging sensor 203 is at a near distance from the exit pupil 130 of the imaging optical system 101 (FIG. 8A). Similarly, the pupil region 133 and the pupil region 134 are also centrally symmetrical on the exit pupil 130 (FIG. 8B). Therefore, if the distance between the exit pupil 130 and the solid-state imaging sensor 203 can be kept at this distance at all times, then ideally the pupil transmittances of the pupil region 131 and the pupil region 132 are the same as each other, and the amount of light incident on the photoelectric conversion unit 221 and the photoelectric conversion unit 222 is the same. Similarly, the pupil transmittances of the pupil region 133 and the pupil region 134 are the same as each other, and the amount of light incident on the photoelectric conversion unit 223 and the photoelectric conversion unit 224 is the same.

However, as described above, the pupil position of the imaging optical system varies with the zoom conditions and the focus conditions, and so on. Furthermore, even if the distance between the exit pupil 130 and the solid-state imaging sensor 203 is kept to a near distance at all times, then there may be cases where decline in the amount of light occurs due to vignetting in the imaging optical system. For the reasons described above, in the ranging pixels which are positioned in a peripheral region of the solid-state imaging sensor, the pupil transmittance of the pupil region 131 and the pupil region 132 and the pupil transmittance of the pupil region 133 and the pupil region 134 are not the same as each other.

Figure 8C:
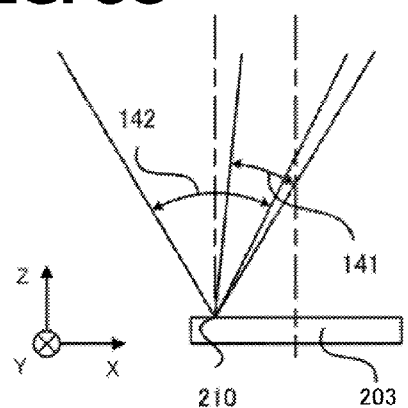
Figure 8D:
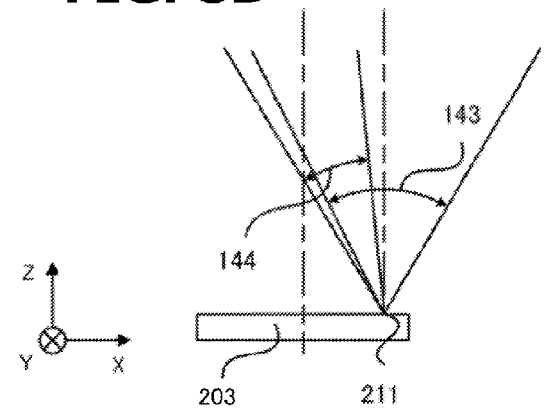

FIGS. 8C and 8D show a case where the exit pupil 130 is at a far distance from the solid-state imaging sensor 203 (this corresponds to a case where an image is captured on the telephoto-side of the zoom lens, for example).

FIG. 8C shows the state of a light beam received by a ranging pixel 210 in the peripheral region 205 in the −X direction (the negative side of the first direction) of the solid-state imaging sensor 203. The photoelectric conversion unit 221 receives a light beam 141 from the pupil region 131, and the photoelectric conversion unit 222 receives a light beam 142 from the pupil region 132. As can be seen from FIG. 8C, the broadening angle of the light beam 142 is greater than the broadening angle of the light beam 141. Therefore, the pupil transmittance of the pupil region 132 is higher than the pupil region 131 and the amount of light received by the photoelectric conversion unit 222 is greater than the amount of light received by the photoelectric conversion unit 221.

FIG. 8D shows the state of a light beam received by a ranging pixel 211 in the peripheral region 206 in the +X direction (the positive side of the first direction) of the solid-state imaging sensor 203. The photoelectric conversion unit 223 receives a light beam 143 from the pupil region 133, and the photoelectric conversion unit 224 receives a light beam 144 from the pupil region 134. As can be seen from FIG. 8D, the broadening angle of the light beam 143 is greater than the broadening angle of the light beam 144. Therefore, the pupil transmittance of the pupil region 133 is higher than the pupil region 134 and the amount of light received by the photoelectric conversion unit 223 is greater than the amount of light received by the photoelectric conversion unit 224.

The positions of the photoelectric conversion units which receive a large amount of light is the opposite of the first embodiment, but if there is a difference in the amount of light received by the two photoelectric conversion units, then there is a problem in terms of a trade-off between saturation and insufficiency of the amount of light, similarly to the first embodiment.

<Effects of Change in Capacitance of Photoelectric Conversion Units>

In the solid-state imaging sensor 203 according to the present embodiment, the depth of the photoelectric conversion units 222, 223 which receive a relatively large amount of light is greater than the depth of the photoelectric conversion units 221, 224 which receive a relatively small amount of light. In other words, the capacitance of the photoelectric conversion units 222, 223 receiving light from the pupil regions 132, 133 having high pupil transmittance is made greater than that of the photoelectric conversion units 221, 224 which receive light from the pupil regions 131, 134 having low pupil transmittance. Therefore, it is possible to simultaneously resolve the insufficiency in the amount of light in the photoelectric conversion units 221, 224 which receive light passing through the pupil regions 131, 134, and the saturation in the photoelectric conversion units 222, 223 which receive light passing through the pupil regions 132, 133.

The method for changing the depth of the photoelectric conversion units has already been described in the first embodiment and therefore further description thereof is omitted here.

<Effects of the Present Embodiment>

As described above, by adopting the present embodiment, it is possible to achieve improvement in the ranging accuracy, throughout the whole surface of the solid-state imaging sensor, regardless of the zoom conditions or the focus conditions, similarly to the case of the first embodiment.

In the present embodiment also, it is possible to adopt the various modifications shown in the first embodiment.

[Third Embodiment]

In the solid-state imaging sensors of the first and second embodiments, the capacitance was changed by means of the depth of the photoelectric conversion unit, whereas in the ranging pixels in the solid-state imaging sensor 303 according to this third embodiment, the capacitance is changed by altering the size (surface area) in the plane of the photoelectric conversion unit. To change the size in the plane of the photoelectric conversion unit, the size of the region of the substrate 113 doped with ions should be changed.

Below, similarly to the first embodiment, a case is described which is optimized when the exit pupil 130 of the imaging optical system 101 is at a position of infinity from the solid-state imaging sensor 303. If the system is optimized in a case where the exit pupil 130 is positioned near to the solid-state imaging sensor, then similarly to the relationship in the first embodiment and the second embodiment, the positional relationship of the photoelectric conversion units should be reversed along the first direction.

Figure 9A:
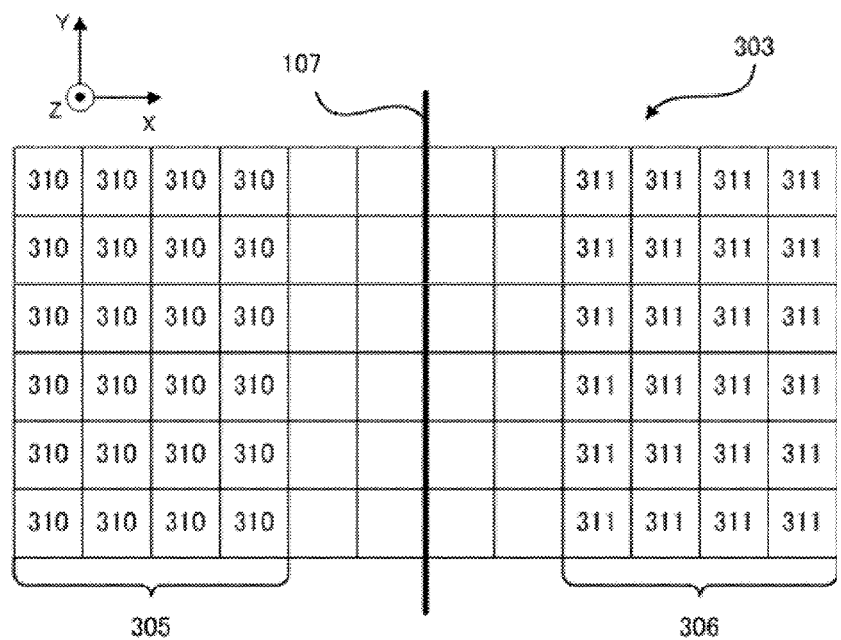
Figure 9A:
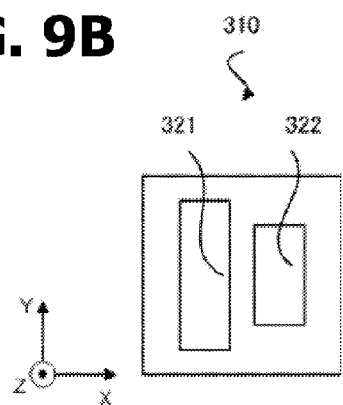
Figure 9A:
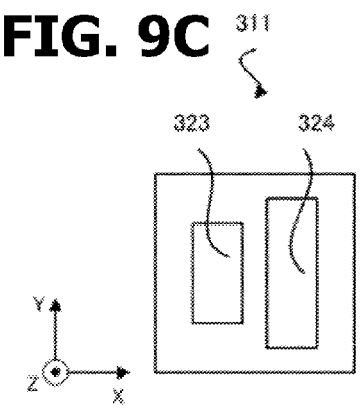
Figure 9A:
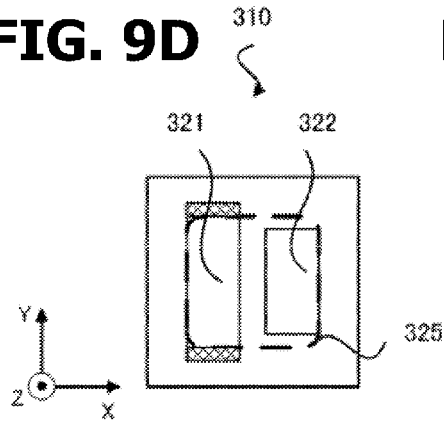
Figure 9A:
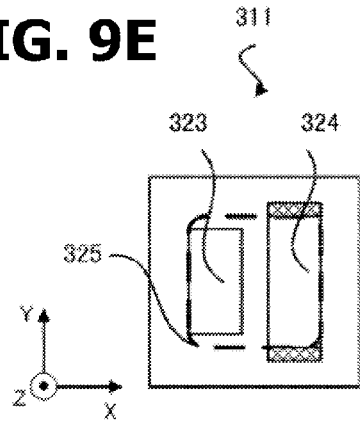

FIG. 9A is a diagram showing an arrangement of the ranging pixels in the solid-state imaging sensor 303. FIGS. 9B and 9C are cross-sectional diagrams showing a composition of the ranging pixels 310 and 311. These diagrams show only the photoelectric conversion units, and similarly to the first embodiment, a microlens 112 is provided on top of each photoelectric conversion unit. The ranging pixel 310 is a ranging pixel which is positioned in the peripheral region 305 in the negative direction (−X direction) of the solid-state imaging sensor 303. In the ranging pixel 310, the length of the photoelectric conversion unit 321 in the second direction (Y direction) which is perpendicular to the first direction is longer than the photoelectric conversion unit 322 (FIG. 9B). On the other hand, the ranging pixel 311 is a ranging pixel which is positioned in the peripheral region 306 in the positive direction (+X direction) of the solid-state imaging sensor 303. In the ranging pixel 311, the length of the photoelectric conversion unit 324 in the second direction (Y direction) which is perpendicular to the first direction is longer than the photoelectric conversion unit 323 (FIG. 9C). In other words, the capacitance of the photoelectric conversion units 321, 324 which receive light from the pupil regions having relatively high pupil transmittance is made greater than the capacitance of the photoelectric conversion units 322, 323 which receive light from the pupil regions having relatively low pupil transmittance. Consequently, it is possible to simultaneously resolve the insufficiency of the amount of light in the photoelectric conversion units which receive light passing through the pupil regions having low pupil transmittance, and saturation in the photoelectric conversion units which receive light passing through the pupil regions having high pupil transmittance.

In a prior art solid-state imaging sensor, a method might be envisaged in which the capacities of the two photoelectric conversion units are both increased. However, there is a problem in that the power consumption is increased unnecessarily, as described in the first and second embodiments. Moreover, if the size in the plane of the photoelectric conversion unit is changed, then the pixel surface area of the ranging pixel is limited, and therefore a problem arises in that it is difficult to increase the capacities of both of the two photoelectric conversion units. In the present embodiment, since the photoelectric conversion units which receive a relatively small amount of light have a relatively small capacitance, and the photoelectric conversion units which receive a relatively large amount of light have a relatively large capacitance, then decline in the quality of the ranging image can be prevented, with a limited pixel surface area.

<Relationship Between Light Receiving Region and Photoelectric Conversion Unit>

As shown in FIGS. 9D and 9E, desirably, the photoelectric conversion units 321, 324 which have a relatively large capacitance (large surface area) are not contained completely in the light receiving region 325 of the ranging pixels 310 and 311. More specifically, it is desirable that a portion of the region of the photoelectric conversion units 321, 324 should be positioned outside the light receiving region 325. This can also be expressed in other words, by stating that the photoelectric conversion units 321, 324 which have a relatively large capacitance include a non-light receiving region which the incident light does not reach. The reasons why a configuration of this kind is desirable are described below. The light receiving region means the region of the substrate surface of the ranging pixels which is reached by the incident light, and this region is determined by the light condensing characteristics of the microlens 112 and the vignetting caused by the wiring, and so on.

If the photoelectric conversion unit is contained completely within the light receiving region, then the amount of light incident on the photoelectric conversion unit becomes greater, as the size of the photoelectric conversion unit in the planar direction is larger. Therefore, if the photoelectric conversion units 321, 324 which have a large capacitance are contained completely in the light receiving region 325, the amount of light incident on the photoelectric conversion units 321, 324 also becomes greater. If the capacitance is made greater in such a manner that the photoelectric conversion units 321, 324 are not contained in the light receiving region, then since the photoelectric conversion units do not receive light in the portions which are not included in the light receiving region (the hatched region in FIG. 9C), then the amount of incident light does not increase. A configuration in which the photoelectric conversion units 321, 324 are not contained in the light receiving region can be achieved by methods such as extending the photoelectric conversion units 321, 324 until the bottom of the wiring, or covering a portion of the photoelectric conversion units 321, 324 with a light shielding film, or the like.

It is desirable to adopt a composition such as that described above since it is thereby possible to easily resolve insufficiency in the amount of the light at the photoelectric conversion units which receive a small amount of light, and saturation in the photoelectric conversion units which receive a large amount of light.

<FD Sharing>

Figure 10A:
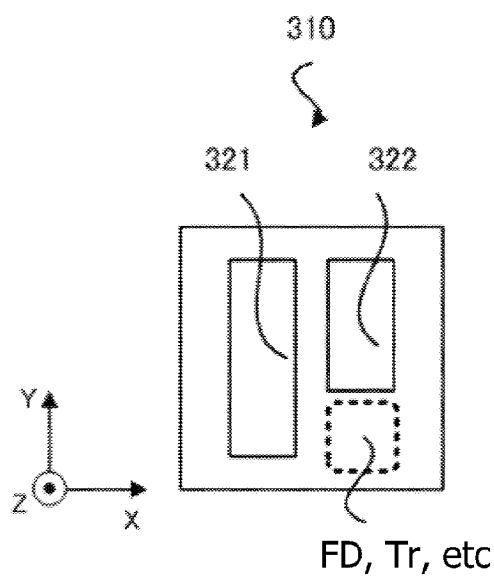
FIGS. 10A to 10D show a modification of a solid-state imaging sensor relating to the third embodiment.
Figure 10B:
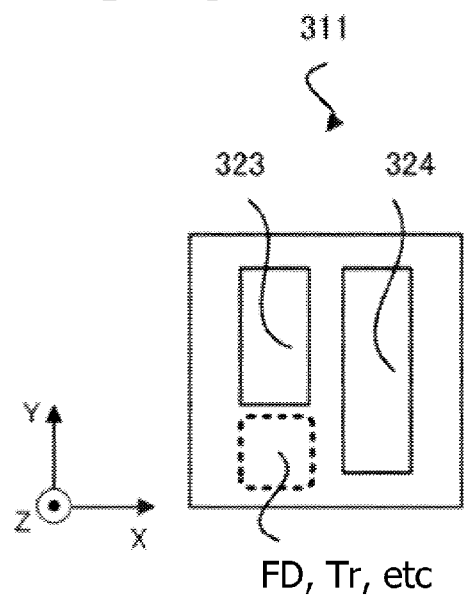

By changing the capacities of the photoelectric conversion units through altering the length in the direction (Y direction) that is perpendicular to the first direction (X direction), a merit is obtained in that transistors (Tr), floating diffusion (FD) and the like can be provided more readily. More specifically, as shown in FIGS. 10A and 10B, the Y-direction length of the photoelectric conversion units 322, 323 is shortened while making the upper end positions of the photoelectric conversion units 322, 323 in the Y direction coincide with the upper end positions of the photoelectric conversion units 321, 324 in the Y direction. In other words, the lower end positions of the photoelectric conversion units 322, 323 in the Y direction are situated to the +Y direction side of the lower end positions of the photoelectric conversion units 321, 324 in the Y direction. By adopting a configuration of this kind, the space below the lower ends of the photoelectric conversion units 322, 323 in the Y direction are left empty, and therefore circuit elements such as transistors or floating diffusions, etc., can be provided in this space. The Y-direction length may also be shortened while keeping the lower end positions of the photoelectric conversion units 322, 323 in the Y direction the same as those of the photoelectric conversion units 321, 324. In this case, an empty space is left to the upper side of the upper ends of the photoelectric conversion units 322, 323 in the Y direction. Apart from these methods, similar beneficial effects are obtained if the Y-direction length of the photoelectric conversion units 322, 323 are shortened in such a manner that the Y positions of the centers of the photoelectric conversion units 322, 323 are shifted with respect to the Y positions of the centers of the ranging pixels 310, 311.

Figure 10C:
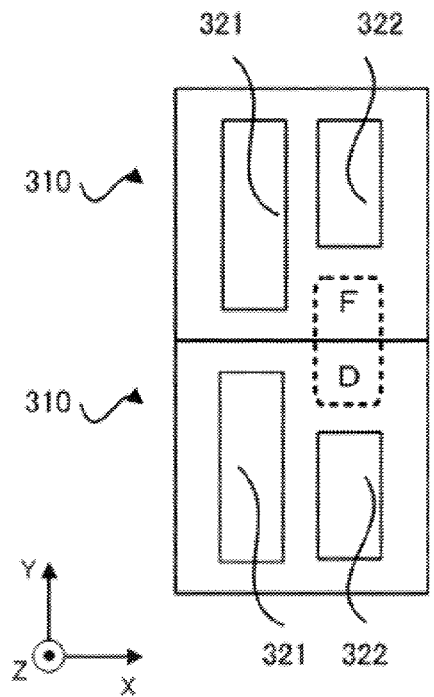
Figure 10D:
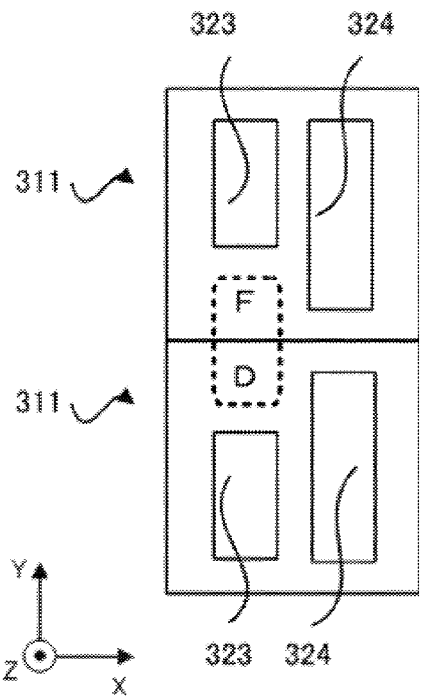

Moreover, as shown in FIGS. 10C and 10D, desirably, in two ranging pixels which are adjacent in the Y direction, the centers of the photoelectric conversion units 322, 323 of the ranging pixels are shifted in a direction away from the adjacent portions of the two ranging pixels. More specifically, in the ranging pixel on the upper side in the Y direction, the upper end of the photoelectric conversion unit 322 in the Y direction is made to coincide with the upper end of the photoelectric conversion unit 321 in the Y direction, and in the ranging pixel on the lower side in the Y direction, the lower end of the photoelectric conversion unit 322 in the Y direction is made to coincide with the lower end of the photoelectric conversion unit 321 in the Y direction. By shortening the Y-direction length of the photoelectric conversion unit 321 under these conditions, it is possible to provide an empty space between the photoelectric conversion units 322 of the two ranging pixels. Desirably, a floating diffusion (electrical charge detection unit) which is shared by the two ranging pixels is arranged in this space. By sharing the floating diffusion between a plurality of pixels, it is possible to increase the freedom of layout, such as the wiring, in a limited pixel surface area.

[Fourth Embodiment]

The solid-state imaging sensor 403 according to the present embodiment changes the capacitance of the photoelectric conversion unit by changing the length in the first direction (X direction).

Below, similarly to the first embodiment, a case is described which is optimized when the exit pupil 130 of the imaging optical system 101 is at a position of infinity from the solid-state imaging sensor 403. If the system is optimized in a case where the exit pupil 130 is positioned near to the solid-state imaging sensor, then similarly to the relationship in the first embodiment and the second embodiment, the positional relationship of the photoelectric conversion units should be reversed along the first direction.

FIG. 11A is a diagram showing an arrangement of the ranging pixels 410, 411 included in the solid-state imaging sensor 403. FIGS. 11B and 11C are cross-sectional diagrams showing a composition of the ranging pixels 410, 411. The ranging pixel 410 is a ranging pixel which is positioned in the peripheral region 405 in the negative direction (−X direction) of the solid-state imaging sensor 403. In the ranging pixel 410, the length of the photoelectric conversion unit 421 in the X direction (first direction) is longer than the photoelectric conversion unit 422 (FIG. 11B). On the other hand, the ranging pixel 411 is a ranging pixel which is positioned in the peripheral region 406 in the positive direction (+X direction) of the solid-state imaging sensor 403. In the ranging pixel 411, the length of the photoelectric conversion unit 424 in the X direction (first direction) is longer than the photoelectric conversion unit 423 (FIG. 11C). Consequently, it is possible to simultaneously resolve the insufficiency of the amount of light in the photoelectric conversion units which receive light passing through the pupil regions having low pupil transmittance, and saturation in the photoelectric conversion units which receive light passing through the pupil regions having high pupil transmittance.

Similarly to the third embodiment, desirably, the photoelectric conversion units 421, 424 which have a large capacitance (large surface area) are not contained completely in the light receiving region 425 of the ranging pixels 410, 411. In other words, the photoelectric conversion units 421, 424 which have a long X-direction length desirably include a non-light receiving region which does not receive incident light.

<Base Length Variation>

Furthermore, it is desirable if the centers of the two photoelectric conversion units in one ranging pixel are displaced in the X direction (first direction) from the center of the light receiving region 425, since this makes it possible to control the properties of the pupil divisions. In particular, by displacing the centers of the two photoelectric conversion units to the side of the photoelectric conversion units 422, 423 which have a small capacitance, as in FIGS. 11D and 11E, it is possible to control the pupil division characteristics without greatly modifying the wiring layout.

[Fifth Embodiment]

In the first to fourth embodiments described above, the capacities of the photoelectric conversion units are changed by altering any of the effective depth, the Y-direction length and the X-direction length of the photoelectric conversion units. In the present embodiment, the capacitance of the photoelectric conversion units is changed by a combination of these plurality of methods. The capacities of the photoelectric conversion units are determined by the product of three dimensions, namely, the effective depth of the photoelectric conversion units, the length in the direction perpendicular to the X direction, and the length in the X direction. By combining these factors, the capacitance of the photoelectric conversion units which receive light passing through the pupil region having a relatively high pupil transmittance may be made greater than the capacitance of the photoelectric conversion units which selectively receive light passing through the pupil region having a relatively low pupil transmittance.

[Sixth Embodiment]

Figure 12A:
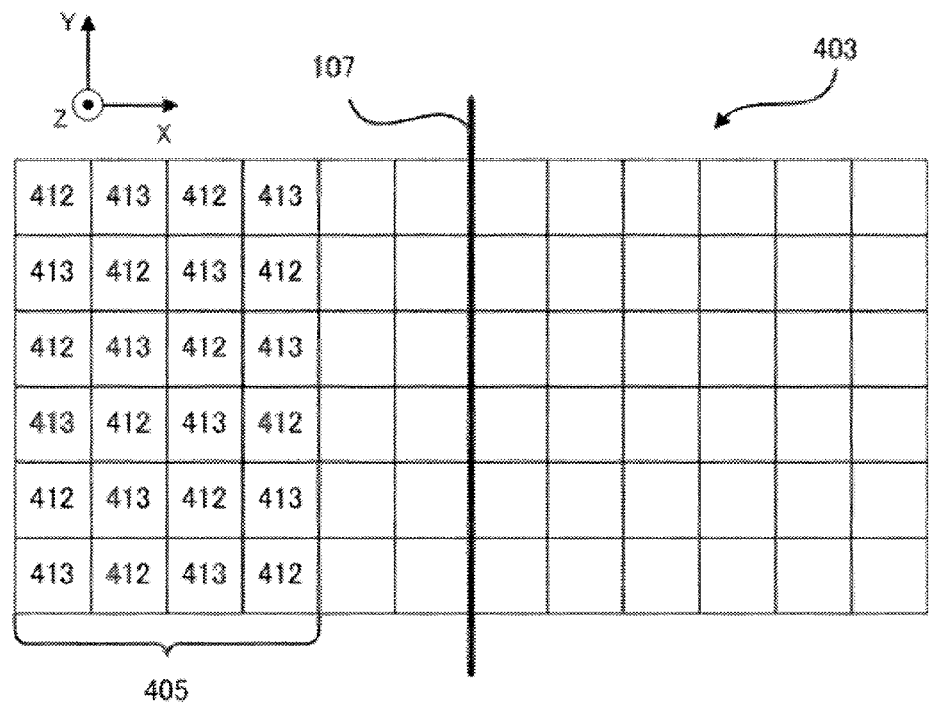
FIGS. 12A and 12B show an arrangement and structure of a solid-state imaging sensor relating to a sixth embodiment of the invention.
Figure 12B:
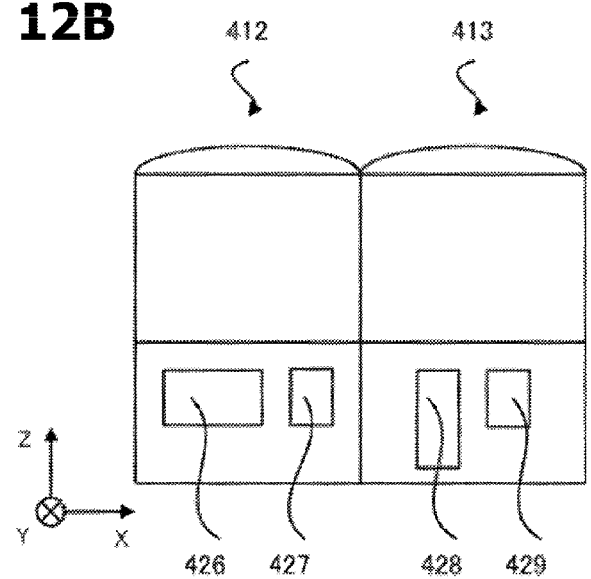

In the first to fifth embodiments described above, the capacitance is changed by the same method in all of the photoelectric conversion units. In the present embodiment, the method of changing the capacitance of the photoelectric conversion units is varied between the ranging pixels. FIG. 12A is a diagram showing an arrangement of ranging pixels in a solid-state imaging sensor 403 according to the present embodiment and FIG. 12B is a cross-sectional diagram showing the configuration of ranging pixels. In the present embodiment, as shown in the drawings, ranging pixels 412 of which the capacitance is changed by the X-direction length are arranged adjacently to ranging pixels 413 of which the capacitance is changed by the depth of the photoelectric conversion unit.

Moreover, the centers of the two photoelectric conversion units in the ranging pixels 412 are displaced in the X direction from the center of the light receiving region 425. Furthermore, the centers of the two photoelectric conversion units in the ranging pixels 413 coincide with the center of the light receiving region 425. In other words, the displacement between the centers of the two photoelectric conversion units in the ranging pixels 412 and the center of the light receiving region is different to the displacement between the centers of the two photoelectric conversion units in the ranging pixels 413 and the center of the light receiving region.

FIGS. 12A and 12B show only the ranging pixels in the peripheral region 405 in the −X direction, but in the peripheral region in the +X direction, the positional relationship of the photoelectric conversion units is reversed in the first direction. By adopting a composition of this kind, it is possible to achieve more highly accurate depth measurement (ranging), regardless of the zoom conditions and the object. The principles behind this are described below.

Figure 13A:
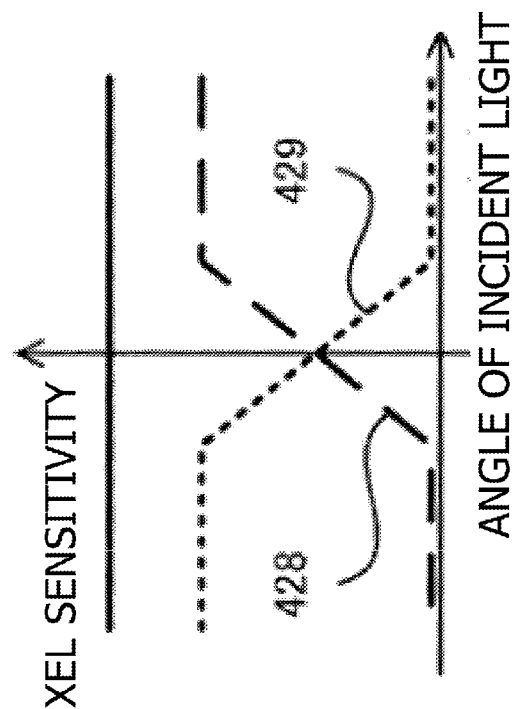
FIGS. 13A and 13B show sensitivity characteristics of ranging pixels relating to the sixth embodiment.
Figure 13B:
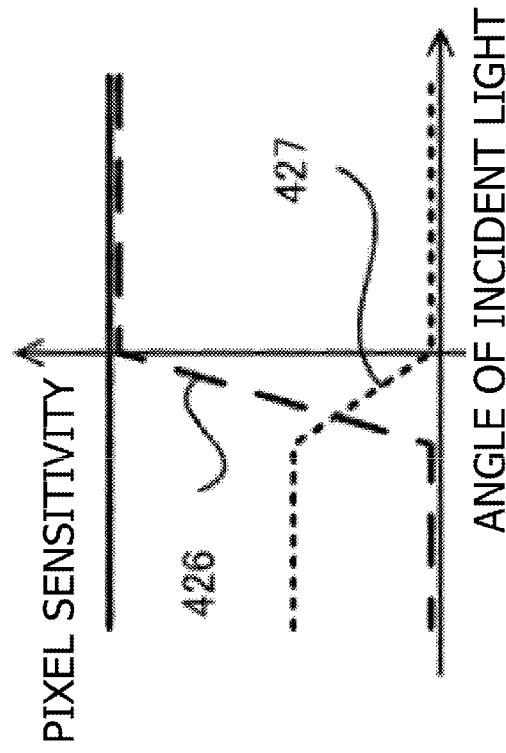

FIGS. 13A and 13B show the sensitivity characteristics of the photoelectric conversion units in the ranging pixels. The pupil region from which the photoelectric conversion unit 426 receives light is biased towards the center from the pupil region from which the photoelectric conversion unit 428 receives light, and the pupil region from which the photoelectric conversion unit 427 receives light is biased further towards the periphery than the pupil region from which the photoelectric conversion unit 429 receives light. Furthermore, the amount of light received by the photoelectric conversion unit 426 is greater than the amount of light received by the photoelectric conversion unit 428, and the amount of light received by the photoelectric conversion unit 427 is smaller than the amount of light received by the photoelectric conversion unit 429.

If depth measurement is carried out using a ranging image acquired by the photoelectric conversion unit 428 and the ranging image acquired by the photoelectric conversion unit 427, then since the distance between the divided pupil regions is long, the ranging accuracy improves. On the other hand, if a ranging image acquired by the photoelectric conversion unit 426 and a ranging image acquired by the photoelectric conversion unit 429 are used, then the amount of light received becomes larger and the quality of the ranging images improves.

Consequently, by switching the photoelectric conversion units used in accordance with the zoom conditions and the object, it is possible to select which of the distance between the pupil regions and the quality of the ranging images is prioritized in depth measurement.

<Adjacent Arrangement of Ranging Pixels>

Desirably, the ranging pixels 412 and the ranging pixels 413 are arranged in mutually adjacent fashion, so as to receive a portion of the light beam from the same object. Preferably, the ranging pixels are arranged at a distance of at most four pixels, and desirably, at most two pixels, apart. FIG. 12 shows an example in which the ranging pixels 412 and the ranging pixels 413 are arranged in adjacent fashion.

[Seventh Embodiment]

In the present embodiment, a case is shown in which the present invention is applied to a solid-state imaging sensor 503 which carries out depth measurement by pupil division in the Y direction.

Below, similarly to the first embodiment, a case is described which is optimized when the exit pupil 130 of the imaging optical system 101 is at a position of infinity from the solid-state imaging sensor 403. If the system is optimized in a case where the exit pupil 130 is positioned near to the solid-state imaging sensor, then similarly to the relationship in the first embodiment and the second embodiment, the relationship between the magnitudes of the capacities of the photoelectric conversion units should be reversed along the Y direction.

Figure 14A:
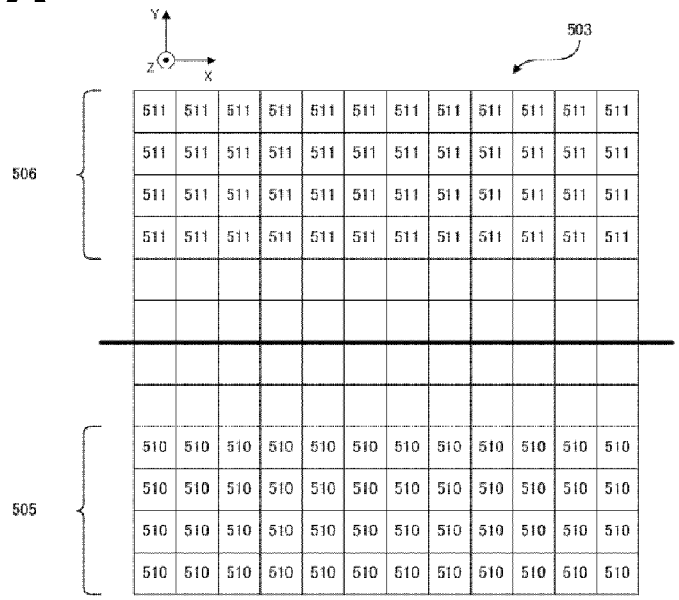
FIGS. 14A to 14C show an arrangement and structure of a solid-state imaging sensor relating to a seventh embodiment of the invention.
Figure 14B:
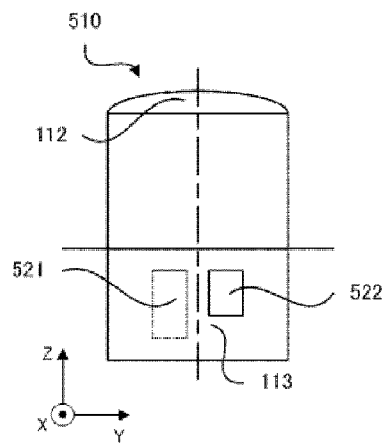
Figure 14C:
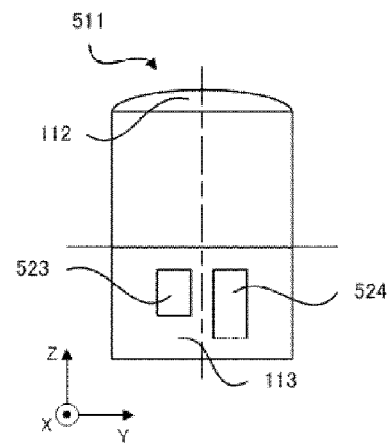

FIG. 14A is a diagram showing an arrangement of the ranging pixels 510, 511 included in the solid-state imaging sensor 503. FIGS. 14B and 14C are cross-sectional diagrams showing a composition of the ranging pixels 510, 511. The photoelectric conversion units 521, 523 and the photoelectric conversion units 522, 524 are formed in a symmetrical arrangement in the Y direction with respect to the optical axis of the microlens 112, in the substrate of the ranging pixels 510, 511. The shapes of the photoelectric conversion units 521, 523 and the photoelectric conversion units 522, 524 in the planar direction of the substrate are the same as each other. By adopting a composition of this kind, it is possible to make the sensitivities of the photoelectric conversion units 521, 523, and the photoelectric conversion units 522, 524 have mutually different dependence on the angle of incidence in the Y-Z cross-section.

Furthermore, the capacitance of the photoelectric conversion units 521, 524 which receive a relatively large amount of light is greater than the capacitance of the photoelectric conversion units 522, 523 which receive a relatively small amount of light. More specifically, the capacitance of the photoelectric conversion unit 521 on the −Y direction side is greater than the photoelectric conversion unit 522 on the +Y direction side, in the ranging pixels 510 which are arranged in the −Y direction peripheral region 505 of the solid-state imaging sensor 503. Furthermore, the capacitance of the photoelectric conversion unit 524 on the +Y direction side is greater than the photoelectric conversion unit 523 on the −Y direction side, in the ranging pixels 511 which are arranged in the +Y direction peripheral region 506 of the solid-state imaging sensor 503. The method of changing the capacitance may employ any of the methods which are described above.

Consequently, it is possible to simultaneously resolve the insufficiency of the amount of light in the photoelectric conversion units 522, 523 which receive light passing through the pupil regions having low pupil transmittance, and saturation in the photoelectric conversion units 521, 524 which receive light passing through the pupil regions having high pupil transmittance. According to the above, it is possible to achieve improvement in the ranging accuracy and improvement in the quality of the captured image, throughout the whole surface of the solid-state imaging sensor, regardless of the zoom conditions or the focus conditions, even with an object constituted by line segments extending in the X direction.

It is also possible to arrange ranging pixels which have pupil divisions in the X direction and ranging pixels which have pupil divisions in the Y direction, simultaneously. In both of these types of ranging pixels, the capacitance is larger in the photoelectric conversion unit which corresponds to a pupil region having a relatively high pupil transmittance, of the two photoelectric conversion units. By adopting a composition of this kind, it is possible to carry out depth measurement in respect of both an object constituted by line segments extending in the X direction, and an object constituted by line segments extending in the Y direction. In this case also, the capacities of the photoelectric conversion units should be determined in accordance with the relationship of magnitudes of the pupil transmittances.

(Other Features)

Figure 15A:
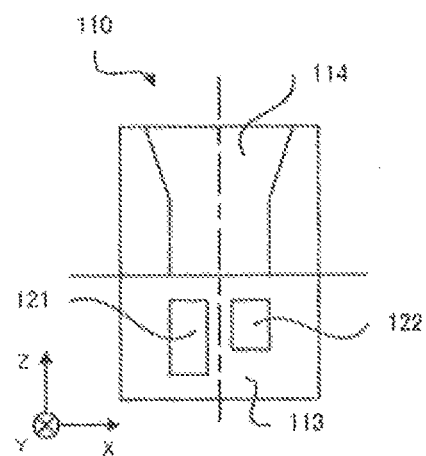
FIGS. 15A to 15C show a structure of a ranging pixel having a waveguide.
Figure 15B:
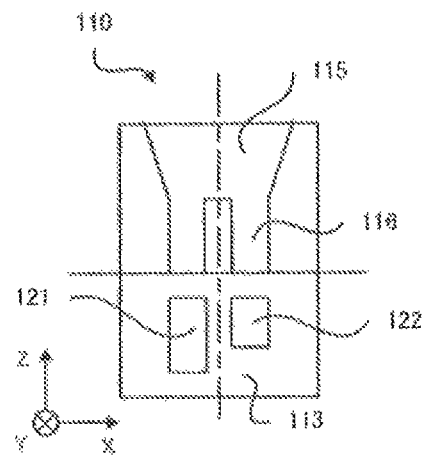
Figure 15C:
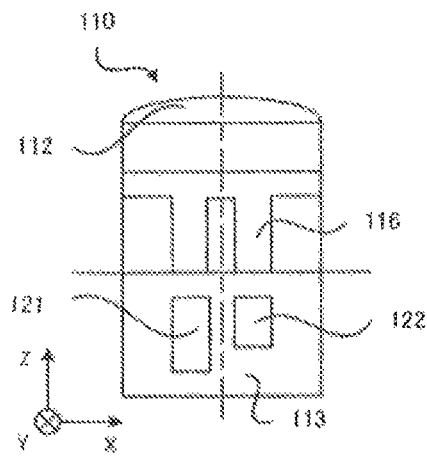

In the embodiment described above, a method based on a microlens is employed as a pupil division method, but the invention is not limited to this. As shown in FIG. 15A, it is also possible to use a waveguide 114 and to divide the pupil by the guide mode. The dominant guide mode when incident light is coupled to the waveguide via the first pupil region is different to the dominant guide mode when incident light is coupled to the waveguide via the second pupil region. Therefore, the light beam passing through the first pupil region can be guided selectively to the first photoelectric conversion unit, and the light beam passing through the second pupil region can be guided selectively to the second photoelectric conversion unit. As shown in FIG. 15B, it is possible to use a waveguide for pupil division 115 and a waveguide for guiding light to the photoelectric conversion unit 116, and as shown in FIG. 15C, it is possible to simultaneously use a microlens for pupil division and a waveguide for guiding light to the photoelectric conversion unit. By using a waveguide, it is possible to efficiently guide the light incident on the pixel to the photoelectric conversion unit, and ranging images of higher quality can be obtained and more accurate depth measurement is possible. In the modification shown in FIG. 15 also, it is possible to combine the eccentricity of the microlens indicated in the second embodiment.

Various embodiments and modifications thereof have been described above, but the present invention can be composed by combining the contents of any of these embodiments and modifications, as possible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-145559, filed on Jul. 11, 2013, Japanese Patent Application No. 2013-183017, filed on Sep. 4, 2013, Japanese Patent Application No. 2014-97073, filed on May 8, 2014, and Japanese Patent Application No. 2014-97074, filed on May 8, 2014 which are hereby incorporated by reference herein in their entirety.

What is claimed is:

1. A solid-state imaging sensor provided with a plurality of pixels which convert an object image formed by an imaging optical system into an electrical signal, at least a portion of the plurality of pixels being ranging pixels in which a first photoelectric conversion unit and a second photoelectric conversion unit are provided in alignment in a first direction, and when a region of the solid-state imaging sensor is divided into a first region and a second region by a straight line perpendicular to the first direction and passing through the center of the solid-state imaging sensor;

then in more than half of the ranging pixels in a region of the first region that is distanced by no less than a predetermined distance from the straight line, a surface area in an imaging plane of the first photoelectric conversion unit is greater than a surface area in an imaging plane of the second photoelectric conversion unit; and in more than half of the ranging pixels in a region of the second region that is distanced by no less than a predetermined distance from the straight line, the surface area in the imaging plane of the second photoelectric conversion unit is greater than the surface area in the imaging plane of the first photoelectric conversion unit.

2. The solid-state imaging sensor according to claim 1, wherein in more than half of the ranging pixels in the first region, the surface area in the imaging plane of the first photoelectric conversion unit is greater than the surface area in the imaging plane of the second photoelectric conversion unit; and in more than half of the ranging pixels in the second region, the surface area in the imaging plane of the second photoelectric conversion unit is greater than the surface area in the imaging plane of the first photoelectric conversion unit.

3. The solid-state imaging sensor according to claim 1, wherein in more than half of the ranging pixels in a region of the first region that is distanced less than a predetermined distance from the straight line, the surface area in the imaging plane of the second photoelectric conversion unit is equal to or greater than the surface area in the imaging plane of the first photoelectric conversion unit; and in more than half of the ranging pixels in a region of the second region that is distanced less than a predetermined distance from the straight line, the surface area in the imaging plane of the first photoelectric conversion unit is equal to or greater than the surface area in the imaging plane of the second photoelectric conversion unit.

4. The solid-state imaging sensor according to claim 1, wherein the predetermined distance is no less than 0.40 times the length of the solid-state imaging sensor in the first direction.

5. The solid-state imaging sensor according to claim 1, wherein the first region is positioned in the negative direction of the first direction from the straight line, and the second region is positioned in the positive direction of the first direction from the straight line.

6. The solid-state imaging sensor according to claim 1, wherein the first region is positioned in the positive direction of the first direction from the straight line; and the second region is positioned in the negative direction of the first direction from the straight line.

7. The solid-state imaging sensor according to claim 1, wherein a difference between the surface area in the imaging plane the first photoelectric conversion unit and the surface area in the imaging plane the second photoelectric conversion unit becomes larger, as the distance between the ranging pixel and the straight line is larger.

8. The solid-state imaging sensor according to claim 7, wherein the capacities of the first photoelectric conversion unit and the second photoelectric conversion unit are made smaller, as the distance between the ranging pixel and the straight line is larger, and a rate of decrease of the surface area in accordance with the distance from the straight line is different for the first photoelectric conversion unit and the second photoelectric conversion unit, thereby the difference becomes larger, as the distance between the ranging pixel and the straight line is larger.

9. The solid-state imaging sensor according to claim 1, wherein the first photoelectric conversion unit and the second photoelectric conversion unit have different lengths in the first direction in the imaging plane.

10. The solid-state imaging sensor according to claim 1, wherein a center of the first photoelectric conversion unit and the second photoelectric conversion unit are displaced towards the side of the photoelectric conversion unit having a smaller surface area in the imaging plane, from the center of the ranging pixel, in the first direction.

11. The solid-state imaging sensor according to claim 1, wherein the photoelectric conversion unit, of the first and second photoelectric conversion units, which has a larger surface area in the imaging plane includes a non-light receiving region on which the light is not incident.

12. The solid-state imaging sensor according to claim 1, wherein the ranging pixel has a microlens, and the first photoelectric conversion unit and the second photoelectric conversion unit are arranged in mutually symmetrical positions with respect to the optical axis of the microlens.

13. The solid-state imaging sensor according to claim 1, wherein the ranging pixels have a waveguide, and incident light is guided to the first photoelectric conversion unit or the second photoelectric conversion unit depending on the angle of incidence of the light at the ranging pixel.

14. The solid-state imaging sensor according to claim 1, at least a portion of the plurality of pixels being second ranging pixels in which a third photoelectric conversion unit and a fourth photoelectric conversion unit are provided in alignment in a second direction perpendicular to the first direction; and when a region of the solid-state imaging sensor is divided into a third region and a fourth region by a second straight line parallel to the first direction and passing through the center of the solid-state imaging sensor, then in more than half of the ranging pixels in a region of the third region that is distanced by no less than a predetermined distance from the second straight line, a surface area in an imaging plane of the third photoelectric conversion unit is greater than a surface area in an imaging plane of the fourth photoelectric conversion unit; and in more than half of the ranging pixels in a region of the fourth region that is distanced by no less than a predetermined distance from the second straight line, the surface area in the imaging plane of the fourth photoelectric conversion unit is greater than the surface area in the imaging plane of the third photoelectric conversion unit.

15. A ranging device; comprising:

an imaging optical system;

the solid-state imaging sensor according to claim 1 which converts an object image formed by the imaging optical system into an electrical signal; and a depth calculation unit which calculates the depth of an object on the basis of signals from the first and second photoelectric conversion units of the solid-state imaging sensor.

16. The ranging device according to claim 15, wherein the first photoelectric conversion unit is composed so as to selectively receive light from a first pupil region, which is a portion of an exit pupil of the imaging optical system;

the second photoelectric conversion unit is composed so as to selectively receive light from a second pupil region, which is a portion of the exit pupil of the imaging optical system and which is different from the first pupil region; and a surface area in an imaging plane of the photoelectric conversion unit corresponding to a pupil region having a higher pupil transmittance of the first and second pupil regions is greater than a surface area in an imaging plane of the photoelectric conversion unit corresponding to a pupil region having a lower pupil transmittance.

17. An imaging apparatus, comprising:

the ranging device according to claim 15; and an object image acquisition unit which acquires an object image on the basis of a signal from the solid-state imaging sensor.

* * * * *